(12) United States Patent
McDaniel et al.

(10) Patent No.: US 6,377,004 B1
(45) Date of Patent: Apr. 23, 2002

(54) THIN VACUUM VALVE FOR PARTICLE ACCELERATOR BEAM LINES

(75) Inventors: Floyd Del McDaniel, Denton, TX (US); James M. Potter, Los Alamos, NM (US); Gan Li, Dallas, TX (US)

(73) Assignee: International Isotopes, Inc., Denton, TX (US)

( * ) Notice: Subject to any disclaimer, the term of this patent is extended or adjusted under 35 U.S.C. 154(b) by 0 days.

(21) Appl. No.: 09/432,278

(22) Filed: Nov. 2, 1999

(51) Int. Cl.$^7$ .......................... H01J 37/20; H01J 37/02
(52) U.S. Cl. ..................... 315/500; 315/505; 315/110; 250/430; 250/497.1
(58) Field of Search ................... 315/500, 505, 315/110; 250/430, 497.1, 526

(56) References Cited

U.S. PATENT DOCUMENTS 4,617,462 A * 10/1986 Holt .......................... 250/251

* cited by examiner

*Primary Examiner*—Jack Berman
*Assistant Examiner*—Nikita Wells
(74) *Attorney, Agent, or Firm*—Munsch Hardt Kopf & Harr, P.C.

(57) ABSTRACT

A thin vacuum valve for particle accelerator beam lines comprising of a frame, a slide, a shaft, a first clamp, and preferably a second clamp, which is easily constructed from highly electrically conductive material and presents substantially smooth, flat surfaces towards adjacent particle accelerator component. The frame has first and second surfaces respectively facing toward the two adjacent particle accelerator system components, the first surface including a slide slot. A frame orifice extends through the frame between the first and second surfaces, preferably at the slide slot, and is positioned and sized on the frame to permit passage of a particle beam generated by the particle accelerator system along a beam line The slide is housed substantially within the slide slot and is movable between a first position and a second position along a slide axis. In the first position, the slide permits a particle beam to pass through the slide orifice and through the frame orifice along the beam line. In the second position, the slide prevents a particle beam from passing through the frame via the frame aperture. The inner sealing surface of the slide engages the slot surface of the frame when the slide is in the second position, thereby substantially vacuum sealing the frame orifice.

Translation of the shaft, which extends from the slide toward the periphery of the frame, selectively controls the movement of the slide between the first and second positions. The first and second clamps engage the slide and maintains the slide substantially within the slide slot. In one embodiment, detents extending from the first and second clamps engage corresponding detents extending from the slide when the slide is in the second position, and thereby bias the slide toward the frame orifice to substantially seal the frame orifice. The frame of the valve may also be incorporated within an end plate of a particle accelerator component.

38 Claims, 10 Drawing Sheets

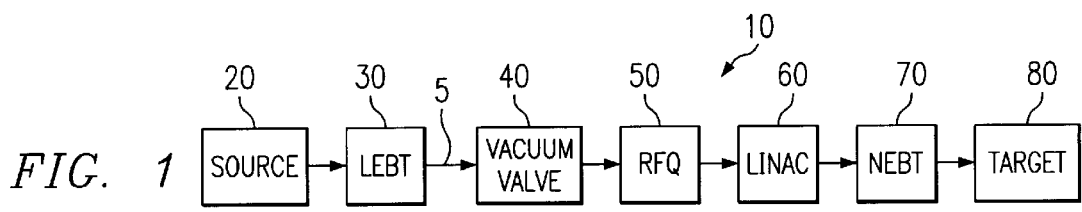
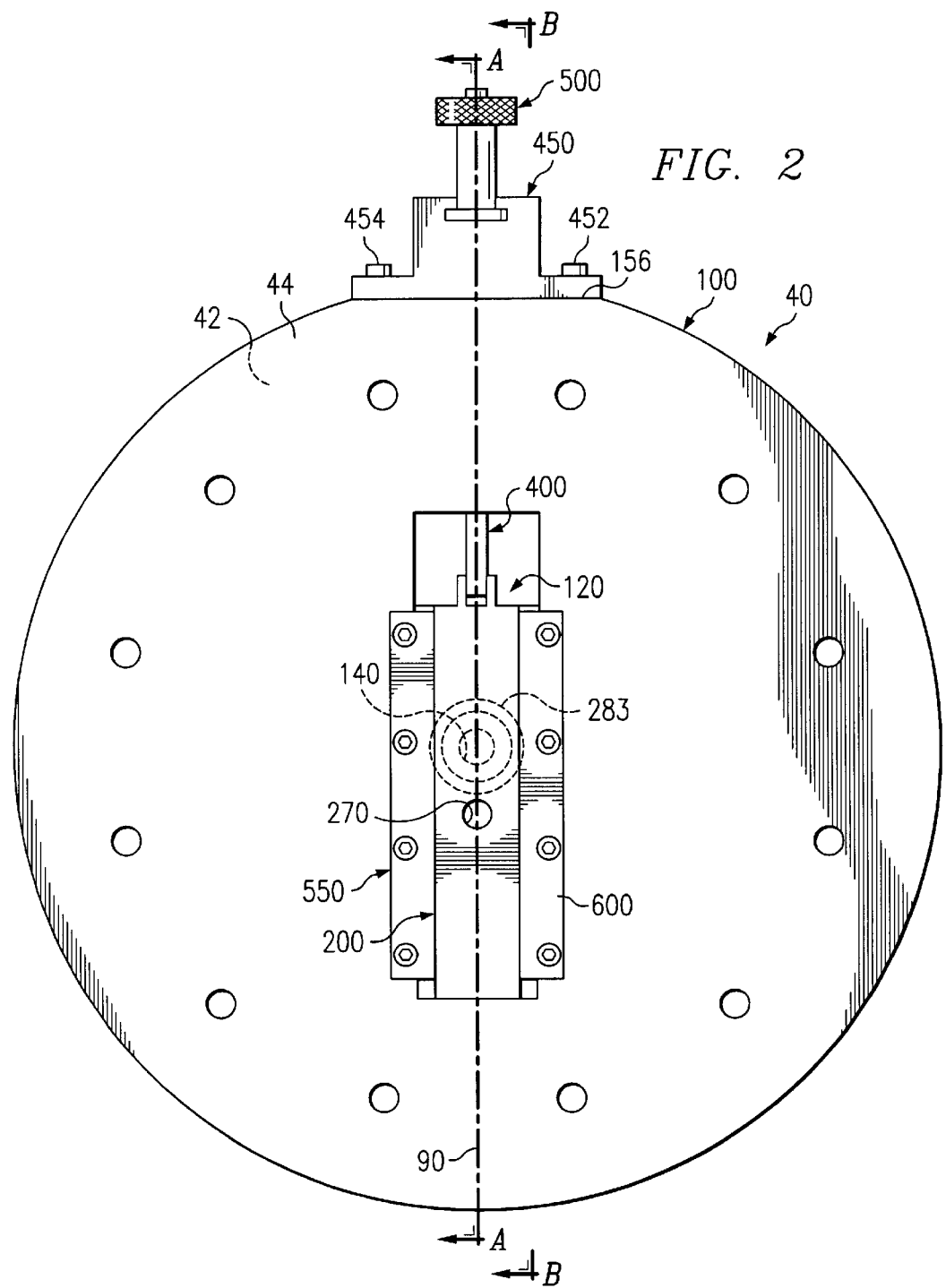

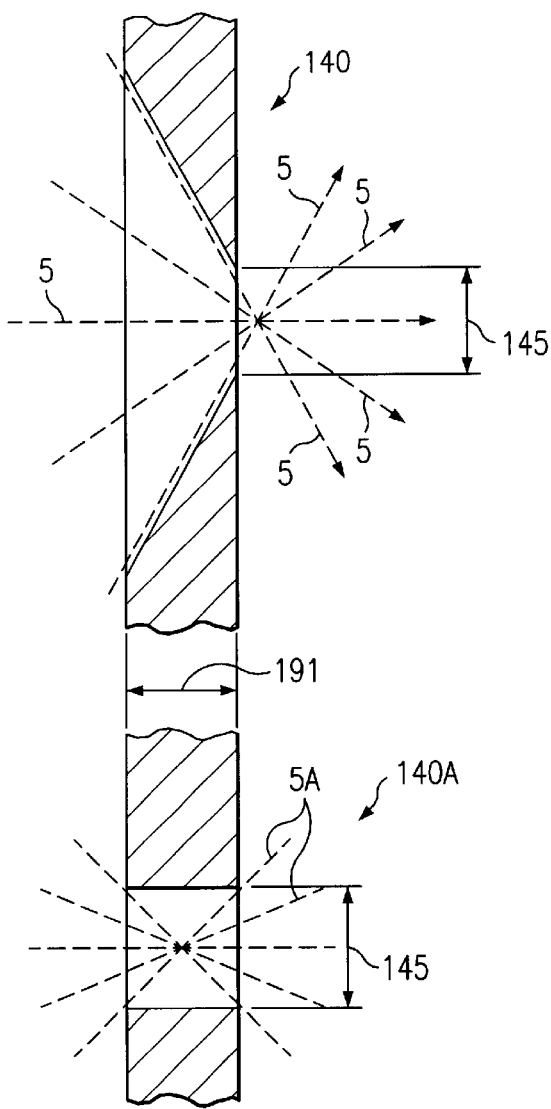
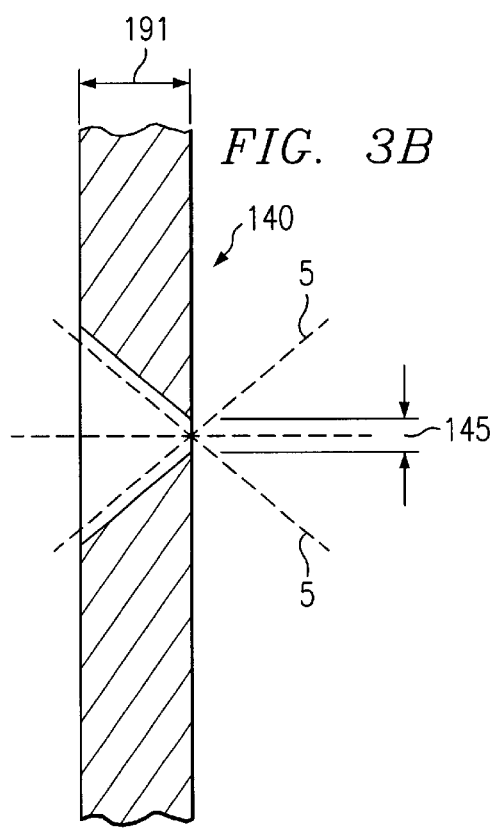
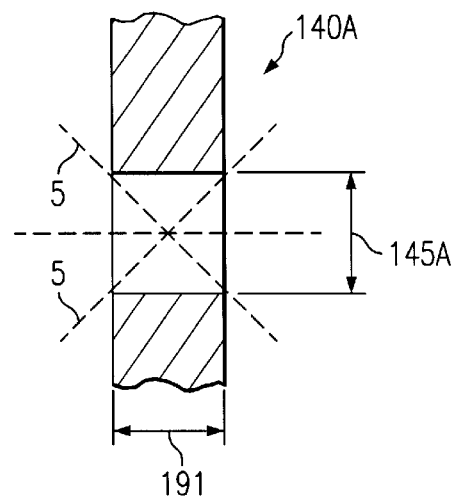
FIG. 3A
FIG. 3B

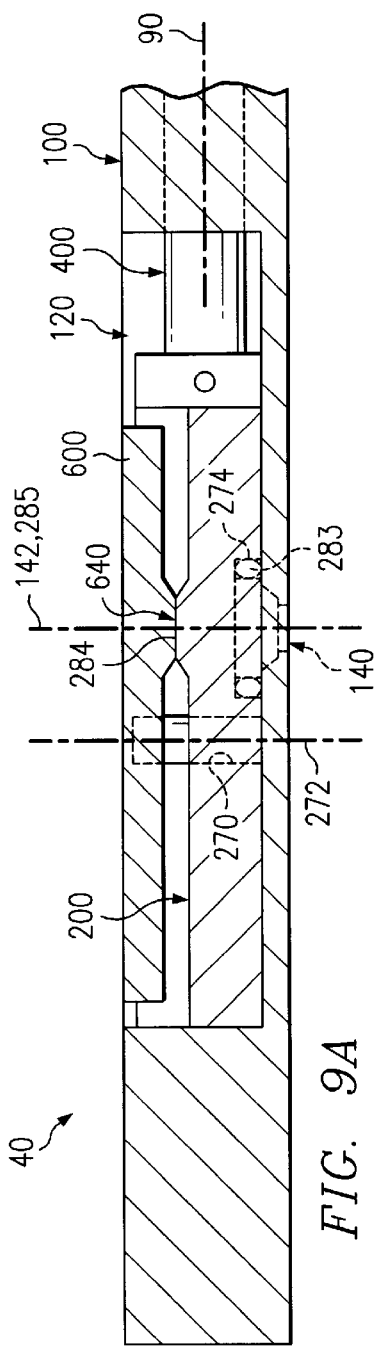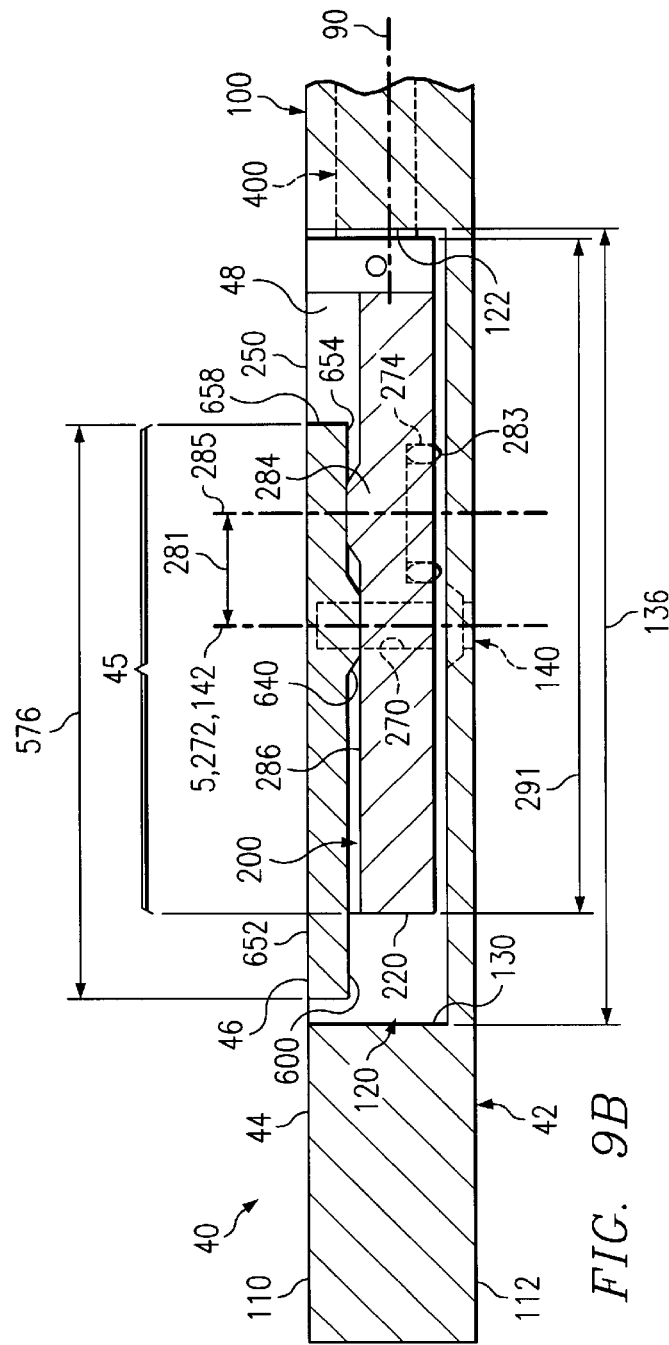

THIN VACUUM VALVE FOR PARTICLE ACCELERATOR BEAM LINES

FIELD OF THE INVENTION

The present invention relates to valves appropriate for maintaining a vacuum. More particularly the present invention relates to a valve capable of isolating particle accelerator system components from exposure to atmosphere while maintaining a vacuum in other system components when the valve is closed, and capable of permitting particle beam passage through the valve when open.

BACKGROUND OF THE INVENTION

Particle accelerator systems are currently available in a variety of types, configurations, and sizes. One consistent feature among these systems, however, is that the interior volume of the particle accelerator system, in which the particle beam is generated and energized, is maintained in a state of vacuum during operation, typically through the use of vacuum pumps. (For the purposes of this specification, a "vacuum" should be understood to refer equally to a "partial vacuum".) Frequently, particle accelerator systems comprise a number of distinct components which are linked along the line of the generated particle beam. As with the particle accelerator system as a whole, the interior volumes of these components are also maintained in a state of vacuum during operation, though atmospheric pressures may vary from component to component.

The interior of these particle beam accelerator components must be accessed from time to time for maintenance, repair, and other purposes. This access may necessitate exposure of the components' interior spaces to the atmosphere and thereby result in a loss of vacuum. However, this loss of vacuum can be advantageously limited to the individual components being accessed, if the accessed components are first isolated from the remainder of the particle accelerator system. Vacuum valves have previously been utilized within particle accelerators as a means of isolating certain beam line components from other components prior to exposure to atmosphere for maintenance, repair, or other purposes.

Traditionally, particle accelerator systems utilized commercially available valves, together with conventional vacuum flanges, to provide vacuum isolation where required. Valves of this type are relatively large (or "thick") when measured parallel to the particle beam line, and the use of such relatively large valves in particle accelerator systems can result in a number of negative consequences.

To understand one way in which an overly "thick" vacuum valve can interfere with the performance of a particle accelerator system, one characteristic of the nature of particle beams should be understood. For the purpose of example only, consider a beam of positively charged Hydrogen ions. Due to the positive charge shared by the ions within the particle beam, the ions naturally repel one another, and the beam diameter therefore tends to expand over time and along the length of the particle accelerator system. Particle accelerators are therefore usually equipped with a series of focusing mechanisms (e.g. quadrupole magnets) to counter this quality of the particle beam.

In a particle accelerator system including multiple components, the diameters of the communicating apertures of adjacent components, through which the particle beam passes, may be limited in size to reduce interference between the operations of those adjacent components. The aperture of any vacuum valve through which the particle beam passes may be similarly limited. Particle beams are often focused to pass through such inter-component apertures with minimum interference from the aperture walls and edges. As the particle beam diameter will tend to expand along the entire length of the aperture between the internal spaces of two adjacent components ("the aperture length"), it is desirable to limit the length of the aperture to prevent interference of the valve aperture with the particle beam. In summary, generally, the thicker the vacuum valve, the greater the aperture length, and the greater the likelihood of particle beam interference.

Accommodating thick vacuum valves is especially difficult toward the "low energy" end of particle accelerator systems where congestion among system components is most acutely experienced. In any location along the particle accelerator system a "thick" vacuum valve could infringe upon the space available for other devices along the beam line, reduce system efficiency, and increase system costs. For example, "thick" vacuum valves may necessitate the use of additional focusing mechanisms, thus further reducing beam line space and increasing costs.

Previously, Donald A. Swenson of Linac Systems constructed an "Ultra Thin Beamline Vacuum Valve" which attempted to satisfy the problems associated with overly thick vacuum valves in particle accelerator systems. Specifically, Mr. Swenson developed a disk-shaped valve which measured only 0.25 inches thick in the direction of the beam line. The vacuum valve featured a relatively small valve aperture at the center of the disk, surrounded by bolts toward the edge of the disk for fastening the vacuum valve to, and sealing the valve against, neighboring system components. The Swenson valve featured a frame and a slide, the slide having a valve aperture on a canted sealing surface. The slide of the Swenson valve moved between a second closed position, in which the slide engaged the canted sealing surface to seal the valve aperture with the aid of an elastomer seal, and a first open position, in which the slide was moved away from the canted sealing surface and permitted the passage of a particle beam through the valve aperture. The sealing surface of the vacuum valve was canted for the purpose of reducing the wear on the elastomer seal located thereon during the opening and closing of the vacuum valve. The vacuum valve offered the advantages of relatively simple construction, featuring only a single moving part and being relatively inexpensive to manufacture. The valve could be constructed from aluminum or steel.

However, the design of the Swenson vacuum valve has serious limitations. One limitation of the Swenson vacuum valve is that the valve was not designed for construction from, or plating with, high purity copper. The interior surfaces of particle accelerator systems, and particularly of high energy particle accelerator systems, are preferably of high purity copper or some other highly electrically conductive material. Another limitation of the Swenson vacuum valve is that the valve, while substantially flat and smooth on one side, possesses significant irregularities on the opposite side. Specifically, the moving parts of the Swenson valve do not smoothly integrate with the surface of the valve's non-moving frame. Such surface irregularities within the interior chambers of particle accelerator components, in which powerful electromagnetic fields are generated, creates a risk of detrimental electrical arcing.

Therefore a need exists for a thin beam-line vacuum valve which is both appropriate for use in the congested areas of a particle accelerator system, and which presents a smooth and highly electrically conductive surface toward both adjacent particle accelerator components.

SUMMARY OF THE INVENTION

The thin vacuum valve for particle accelerator beam lines of the instant invention addresses these needs. Specifically, the vacuum valve is easily constructed from highly electrically conductive material, such as oxygen-free high-purity copper, and presents smooth, flat surfaces toward each adjacent particle accelerator component. The valve is comprised of a frame, a slide, a shaft, and preferably a first and second clamp.

The frame has a slide axis, first and second surfaces respectively facing toward the two adjacent particle accelerator system components, and an outer frame wall between the first and second surfaces. The first surface of the frame includes a slide slot having a slot surface and a frame orifice extending through the frame between the first or slot surface and the second surface. The frame orifice is positioned and sized on the frame to permit passage of a particle beam generated by the particle accelerator system along a beam line;

The slide has a slide orifice, an outer surface, and an inner sealing surface. The slide is housed substantially within the slide slot and is movable between a first position and a second position along a slide axis. In the first position, the slide permits a particle beam to pass through the slide orifice and through the frame orifice along the beam line. In the second position, the slide prevents a particle beam from passing through the frame via the frame aperture. The inner sealing surface of the slide engages the slot surface of the frame when the slide is in the second position, thereby substantially vacuum sealing the frame orifice.

The shaft is translatable relative to the frame in a direction substantially parallel to the slide axis. The shaft extends from the slide in a direction substantially perpendicular to the slide axis and toward the outer frame wall. Translation of the shaft selectively controls the movement of the slide between the first and second positions.

The first clamp has a first inner clamp surface and an outer first clamp surface. The first inner clamp surface engages a first side of the slide and maintains the slide substantially within the slide slot.

The second clamp has a second inner clamp surface and an outer second clamp surface. The second inner clamp surface engages a second side of the slide substantially opposite the side of the slide contacted by the first inner clamp surface, and maintains the slide substantially within the slide slot.

The outer surface of the slide and the first surface of the frame form a substantially flat surface substantially perpendicular to the beam line and surrounding the slide orifice. The second surface of the frame forms a substantially flat surface substantially perpendicular to the beam line and surrounding the frame orifice.

In one embodiment, the slide has a first slide detent extending toward the first clamp and a second slide detent extending toward the second clamp, the first clamp has a first clamp detent extending toward the slide, and the second clamp has a second clamp detent extending toward the slide. The first clamp detent is positioned to engage the first slide detent, and the second clamp detent is positioned to engage the second slide detent, when the slide is moved from the first position to the second position. The inner surface of the slide is thereby biased toward the frame orifice and against the slot surface to substantially seal the frame orifice when the slide is in the second position.

In another embodiment, the frame of the valve is the end plate of one of the particle accelerator components.

BRIEF DESCRIPTION OF THE DRAWINGS

FIG. 1 provides a flow-chart diagram of one potential use of the beam-line vacuum valve 40 of the instant invention.

FIG. 2 provides a forward orthogonal view of an embodiment of the beam-line vacuum valve of the instant invention.

FIG. 3A provides a side cross-sectional view of frame orifice 140 of the embodiment of FIG. 2 taken along line A—A of FIG. 2 and illustrating the advantages of a conical frame orifice 140 design.

FIG. 3B provides a side cross-sectional view of frame orifice 140 of the embodiment of FIG. 2 taken along line A—A of FIG. 2 and illustrating the advantages of a conical frame orifice 140 design.

FIG. 9A provides a side cross-sectional view of a portion of the embodiment of FIG. 2, taken along line B—B of FIG. 2, and illustrating slide 200 in the second closed position.

FIG. 9B provides a side cross-sectional view of a portion of the embodiment of FIG. 2, taken along line B—B of FIG. 2, and illustrating slide 200 in the first open position.

DESCRIPTION OF THE PREFERRED EMBODIMENTS

Figure 3:
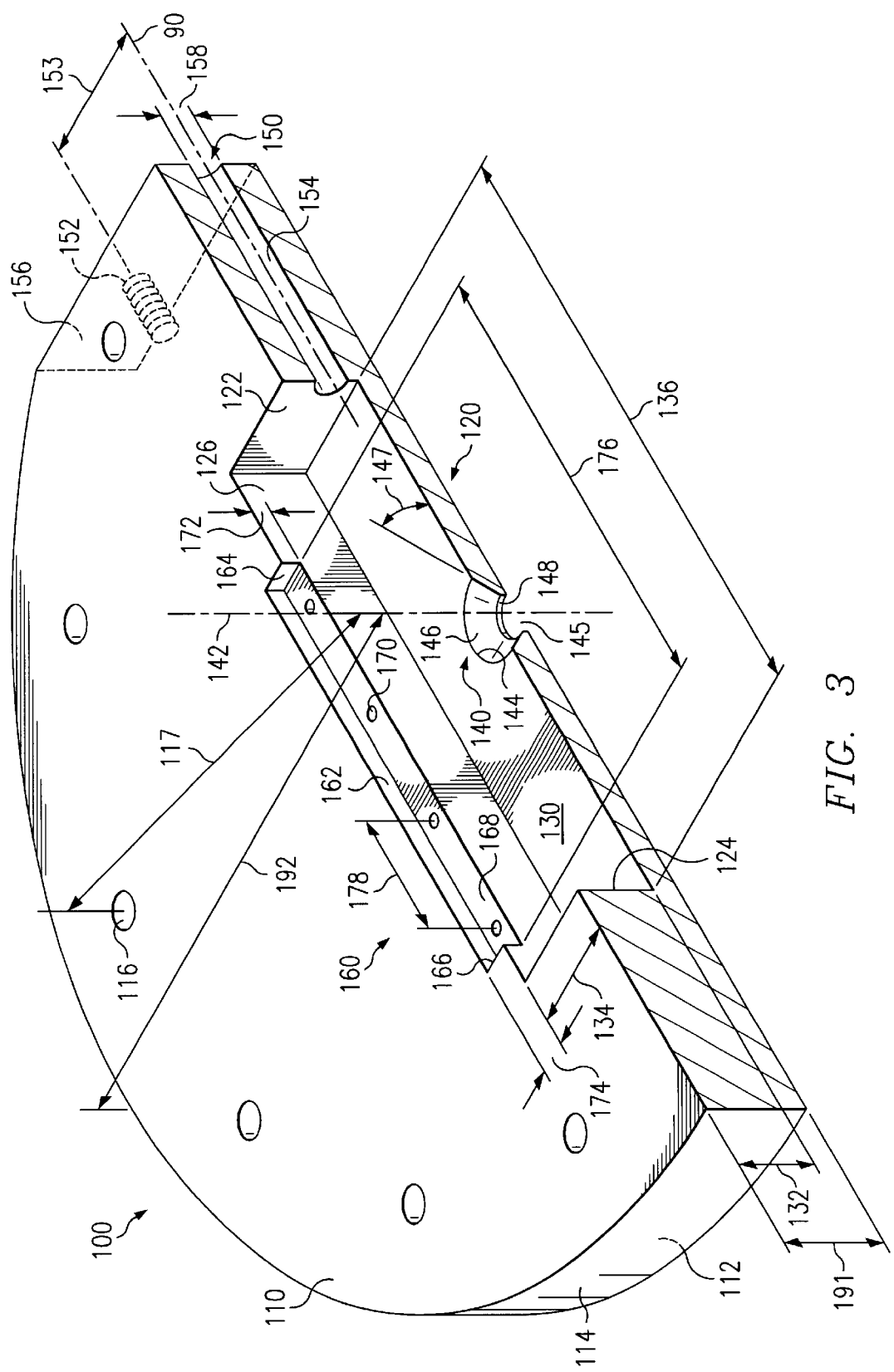
FIG. 3 provides a forward perspective cross-sectional view of frame 100 of the embodiment of FIG. 2 taken along line A—A of FIG. 2.

FIG. 1 provides a flow-chart diagram of one potential use of the beam-line vacuum valve 40 of the instant invention. Valve 40 is utilized between two components of a particle accelerator system 10 to aid in isolation, service and maintenance of those components. Particle accelerator system 10 comprises the following components in succession along the particle beam line 5: a particle source 20; a low-energy beam transport system ("LEBT") 30; a radio frequency quadrupole ("RFQ") 50; a drift tube linear accelerator ("LINAC") 60; a high-energy beam transport 70; and ultimately a target 80. As illustrated, a valve 40 is located between and is coupled to LEBT 30 and RFQ 50. Both LEBT 30 and RFQ 50, as well as most other particle accelerator components, are maintained in a state of vacuum during operation. Therefore the coupling of valve 40 to RFQ 50 and LEBT 30 will form a seal sufficient to maintain that state of vacuum within the particle accelerator system. It should be understood that the valve of the instant invention can be utilized between other particle accelerator components, and in particle accelerators systems in which no LEBT or RFQ is used at all. In addition, it should be understood that while valve 40 is a component separate and distinct from, but coupled to, two particle accelerator system components, the valve of the instant invention may also be formed as an integral part of a particle accelerator system component. For example, the valve of the instant invention may be incorporated into the high-purity copper end plate of a RFQ.

When open in a first position, valve 40 permits a particle beam extracted from a particle source 20 and transported by LEBT 30 to continue through valve 40 and into RFQ 50. When valve 40 is closed in a second position, valve 40 isolates LEBT 30 from RFQ 50, thereby permitting either LEBT 30 or RFQ 50 to be repressurized and uncoupled from valve 40 for service, maintenance, or other purposes, while maintaining a vacuum in the component still coupled to valve 40. Though this particular function is not unique to the valve of the present invention, valve 40 does offer significant benefits unrealized with the prior art.

Specifically, valve 40 is a significantly thinner, measured parallel to beam line 5, and presents relatively flatter electrical surfaces toward each of the adjacent particle accelerator system 10 components to which valve 40 is coupled. These flat electrical surfaces help prevent distortions of the electrical fields generated by the particle accelerator system components and prevent detrimental electrical arcing toward valve surface irregularities during operation of particle accelerator system 10.

FIG. 2 provides a forward orthogonal view of an embodiment of the thin beam-line vacuum valve of the instant invention. Valve 40 has a down-beam side 42 and an up-beam side 44, and comprises a substantially circular frame 100, a slide 200, a valve shaft 400, a valve cap 450, a knurled knob 500, a first clamp 550 and a second clamp 600. For the purpose of this specification, "up-beam refers to the direction toward particle source 20, and "down-beam" refers to the direction away from particle source 20. Frame 100 is symmetrical about line A—A and substantially circular in configuration. Frame 100 has a slide slot 120 and a frame orifice 140 (not visible, the position of which is illustrated by broken lines). Slide 200 has a slide orifice 270, is positioned within slide slot 120, and is movable along a slide axis 90 between a first position and a second position. In the first position of slide 200 (not illustrated), slide orifice 270 is substantially co-linear with frame orifice 140 and a particle beam may pass through valve 40. In the second position of slide 200, as illustrated in FIG. 2, there is no overlap between frame orifice 140 and slide orifice 270 and a particle beam may not pass through valve 40.

First clamp 550 and second clamp 600 help maintain slide 200 within slide slot 120. When slide 200 is in the second position, first clamp 550 and second clamp 600 force o-ring 283 (not visible, the position of which is illustrated by broken lines) of slide 200 against frame 100, thereby forming a seal across frame orifice 140 of sufficient strength to maintain a vacuum. The seal formed by o-ring 283 is preferably of sufficient strength to maintain an atmospheric pressure of $10^{-7}$ torr in either adjacent coupled component upon the decoupling of the opposite adjacent coupled component.

Shaft 400 couples with slide 200 and extends through frame 100 and toward the periphery of frame 100 along slide axis 90. Cap 450 is rigidly coupled to frame 100 along coupling surface 156, by two screws, 452 and 454, extending through cap 450 and into frame 100, in a direction substantially parallel to slide axis 90. Cap 450 rotatably engages knob 500 to substantially fix the position of knob 500 along slide axis 90 while permitting knob 500 to rotate about slide axis 90. Shaft 400 extends through frame 100 and cap 450 and engages knob 500.

Frame 100, slide 200, and first and second clamps 550 and 600 are preferably constructed from a highly electrically conductive material, and most preferably constructed from oxygen-free high-purity copper. Highly conductive materials, such as oxygen-free high-purity copper, are less likely to adversely affect electromagnetic fields generated within particle accelerator system components, than less conductive materials. For the purpose of this specification, a valve 40 component plated with a material should be understood as being "constructed from" that material.

FIG. 3 provides a forward perspective cross-sectional view of frame 100 of the embodiment of FIG. 2 taken along line A—A of FIG. 2. Frame 100 has parallel first and second surfaces 110 and 112, a substantially cylindrical outer frame wall 114 between surfaces 110 and 112, and a substantially centrally located frame orifice 140.

Twelve securement apertures 116 (only six of which are illustrated in FIG. 3) extend through frame 100 from first surface 100 to second surface 112. Securement apertures 116 are substantially cylindrical in configuration and are oriented substantially parallel to central axis 142 of frame orifice 140. Each securement aperture 116 is located substantially equidistant from adjacent securement apertures 116, and a securement radius 117 from frame orifice 140 (measured aperture center to orifice center), to form a substantially circular pattern of securement apertures 116 near outer frame wall 114. Securement apertures 116 may be either threaded or substantially smooth. Securement apertures 116 are used to secure frame 100, preferably by bolts, to adjacent particle accelerator components. Therefore the exact position of securement apertures 116 on frame 100 is dependent upon the position of matching securing mechanisms (such as bolts or other apertures) on those adjacent particle accelerator components. It should be noted that securement aperture 116 configurations other than that illustrated in FIG. 3 may also utilized to secure the valve of the instant invention to adjacent particle accelerator 10 components. In addition, it should be recognized that means other than bolts and apertures may be utilized to secure the valve of the instant invention to adjacent components. Further, any securing means utilized to secure the valve of the instant invention to adjacent components may be incorporated solely within the adjacent components, and not within the valve itself. Any securing means utilized, however, should be capable of forming a seal of sufficient strength to maintain a vacuum within the interior spaces of adjacent, coupled, particle accelerator 10 components. Other acceptable securing means include, but are not limited to, edge clamps. Securement apertures 116, or other securing means, may be used in conjunction with seals, such as o-rings, located between frame 100 and adjacent particle accelerator system 10 components.

Frame thickness 191 is the distance between, and perpendicular to, first and second surfaces 110 and 112. Frame radius 192 is the distance between outer frame wall 114 and central axis 142, measured perpendicular to central axis 142. The frame 100 embodiment illustrated in FIG. 3, and the valve 40 embodiment of FIG. 2, is appropriate for use in a particle accelerator system 10 of the type illustrated in FIG. 1, wherein the particle beam passing through the valve reaches an energy level of up to tens of MeVs, and wherein the atmospheric pressure experienced within the RFQ 50 may reach a minimum of $10^{-8}$ torr, and the atmospheric pressure experienced within the LEBT 30 may reach a minimum of $10^{-3}$ torr during source operation, and may reach atmospheric pressure when the source is not operating or is being serviced. Frame thickness 191 for valves 40 independent from adjacent particle accelerator 10 components, is preferably 0.5 inches or less, and for valves integral to a particle accelerator 10 component, is preferably 1.0 inches or less. For example, an appropriate frame thickness 191 for valve embodiment 40 is about 0.5 inches, and an appropriate frame radius 192 is about 6 inches.

Slide slot 120 of frame 100 is substantially rectangular in configuration, and is defined by parallel end walls 122 and 124, parallel slot side walls 126 and 128 (slot side wall 128 is not illustrated), and a slide slot surface 130. Slide slot surface 130 is substantially parallel to first surface 110 and substantially perpendicular to walls 122, 124, 126, and 128. Slot side walls 126 and 128 are parallel to slide axis 90. The intersections of end walls 122 and 124 with slot side walls 126 and 128 may be rounded as illustrated.

Slide slot depth 132 is the distance between, and perpendicular to, slide slot surface 130 and first surface 110. Slide slot half-width 134 is the distance between slot side wall 126 and central axis 142 measured perpendicular to central axis 142. Slide slot length 136 is the distance between, and perpendicular to, end walls 122 and 124. For purpose of example, an appropriate slide slot depth 132, half-width 134, and length 136 for valve embodiment 40 is about 0.41 inches, 0.79 inches, and 6.50 inches respectively.

Frame orifice 140, having central axis 142, extends between slide slot surface 130 and second surface 112, and is substantially centrally located in frame 100. Central axis 142 is substantially perpendicular to slide slot surface 130. Frame orifice 140 is preferably substantially conical in configuration, having an inclined orifice wall 146. Frame orifice 140 has a greater diameter 144 at the intersection with slide slot surface 130, and a lesser diameter 145 at the intersection with second surface 112. A substantially cylindrical rim wall 148 preferably connects inclined orifice wall 146 to second surface 112, thereby avoiding a sharp and fragile direct intersection between inclined orifice wall 146 and second surface 112. The angle between inclined orifice wall 146 and slide slot surface 130 is inclined wall angle 147. Frame orifice 140 should be positioned in frame 100 so that a particle beam generated by particle accelerator system 10 along beam line 5 and extending through valve 40 will be substantially co-linear with central axis 142. For purpose of example, an appropriate greater diameter 144, and lesser diameter 145, for valve embodiment 40, is about 0.64 inches and about 0.40 inches respectively, and an appropriate inclined wall angle 147 is about 30 degrees.

Several advantages may be realized from the use of conical frame orifice 140 configurations, as opposed to cylindrical frame orifice 140A configurations, as illustrated in FIGS. 3A and 3B, which provide cross-sections of frame orifice 140 taken through line A—A of FIG. 2. FIG. 3A illustrates how, for a given frame thickness 191 and lesser orifice diameter 145, a particle beam may be more sharply focused through a conical frame orifice 140 than through a cylindrical frame orifice 140A. Sharper beam focusing advantageously reduces the length along beam line 5 to be used for focusing, such as within LEBT 30. FIG. 3B illustrates how, for a given frame thickness 191 and particle beam, conical frame orifice 140 may have a smaller lesser diameter 145 than lesser diameter 145A of cylindrical frame orifice 140A. A smaller lesser orifice diameter 145 advantageously permits better isolation of adjacent coupled particle accelerator 10 components during operation.

Returning to FIG. 3, coupling surface 156 is substantially flat and substantially perpendicular to slide axis 90. A substantially cylindrical frame bore 150 extends along slide axis 90 between end wall 122 and coupling surface 156, and has a bore diameter 158 measured perpendicular to slide axis 90. Frame bore 150 is oriented and sized to receive valve shaft 400 (not illustrated in FIG. 3). Bore wall 154 of frame bore 150 is preferably substantially smooth. Slide axis 90 and frame bore 150 are each disposed approximately midway between first surface 110 and second surface 112. For purpose of example, an appropriate bore diameter 158 for valve embodiment 40 is about 0.26 inches. It should be understood that, though preferred, the existence of a frame bore is not a requirement of the instant invention, and that other mechanisms slide 200 to outer frame wall 114 (e.g. a three sided channel cut into first surface 110) are also acceptable.

Two substantially cylindrical threaded holes 152 (not visible in FIG. 3, but the position of which is illustrated by broken lines), oriented substantially parallel to slide axis 90, are located on coupling surface 156. Holes 152 are located substantially midway between first surface 110 and second surface 112, and are substantially equidistant from frame bore 150. Distance 153 is measured between the center of hole 152 and slide axis 90, and perpendicular to slide axis 90. For purpose of example, an appropriate distance 153 for valve embodiment 40 is about 1.15 inches, and each hole 152 is threaded to receive a #7-20 screw to a depth of 0.75 inches.

Frame 100 further includes a first clamp recess 160 along the intersection of slot side wall 126 and first surface 110. First clamp recess 160 is substantially rectangular in configuration, and is defined by recess side wall 162, parallel recess end walls 164 and 166, and first recess surface 168. First recess surface 168 is substantially parallel slide slot surface 130, and substantially perpendicular to recess walls 162, 164, and 166. Recess side wall 162 is parallel to slide axis 90.

Recess depth 172 is the distance between, and perpendicular to, first recess surface 168 and first surface 110. Recess width 174 is the distance between, and perpendicular to, recess side wall 162 and slot side wall 126. Recess length 176 is the distance between, and perpendicular to, recess end walls 164 and 166. For purpose of example, an appropriate recess depth 172, width 174, and length 176 for valve embodiment 40 is about 0.13 inches, 0.34 inches, and 4.93 inches respectively.

Four substantially cylindrical threaded holes 170, oriented substantially parallel to central axis 142, are located on first recess surface 168. Holes 170 are located substantially midway between recess side wall 162 and slot side wall 126. The inter-hole distance 178 between each pair of adjacent holes 170, measured from hole center to hole center, is preferably about equal. For purpose of example, an appropriate inter-hole distance 178 for valve embodiment 40 is about 1.40 inches, and each hole is threaded to receive a #6-32 screw to a depth of 0.25 inches.

Frame 100 further includes a second clamp recess 180 (not illustrated in FIG. 3) along the intersection of slot side wall 128 and first surface 110. Second clamp recess 180 substantially mirrors first clamp recess 160 about cross-section A—A.

Figure 4:
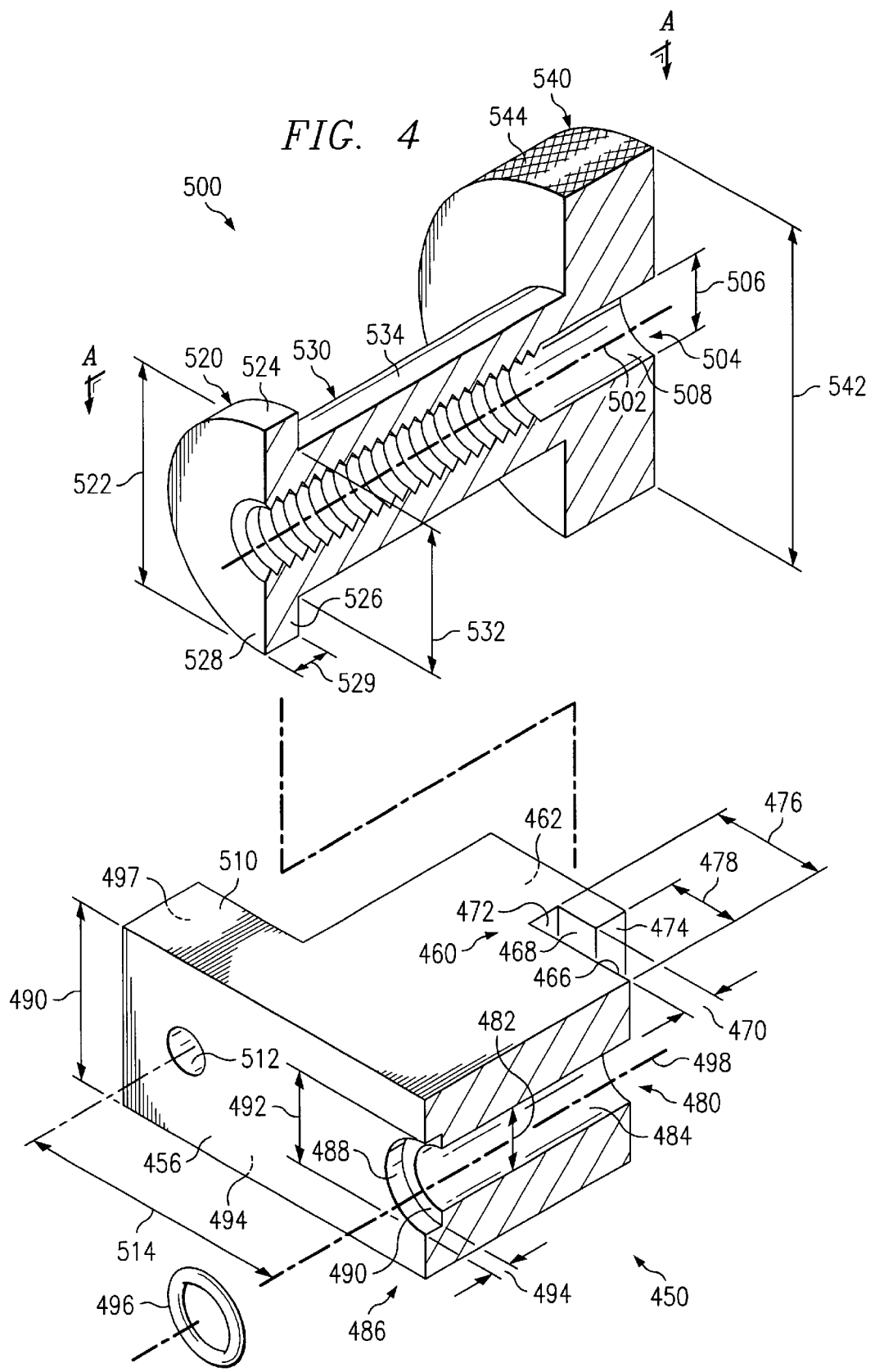
FIG. 4 provides a forward perspective cross-sectional view of valve cap 450 and knurled knob 500 of the embodiment of FIG. 2 taken along line A—A of FIG. 2.

FIG. 4 provides a forward perspective cross-sectional view of valve cap 450 and knurled knob 500 of the embodiment of FIG. 2 taken along line A—A of FIG. 2. Cap 450 includes a flat coupling surface 456 and a parallel contact surface 466. A substantially cylindrical cap bore 480 extends between, and is perpendicular to, coupling surface 456 and contact surface 466. Cap bore 480 has a cap bore diameter 482 measured parallel to contact surface 466, a substantially smooth cap bore wall 484, and a cap axis 498. Cap bore 480 is oriented and sized to receive valve shaft 400, and to align cap axis 498 with slide axis 90, when cap 450 is rigidly coupled to frame 100 (as illustrated in FIG. 2). Cap 450 has a cap thickness 490 measured between, and perpendicular to, parallel cap side surfaces 492 and 494. Cap thickness 490 is preferably about equal to frame thickness 191, and cap bore diameter 482 is about equal to bore diameter 158. Cap bore 480 is disposed approximately midway between cap side surfaces 492 and 494.

Cap bore 480 includes a substantially cylindrical and co-centric o-ring recess 486 along the intersection of cap bore 480 and coupling surface 456. O-ring recess 486 is defined by a substantially smooth o-ring recess wall 488 and an o-ring recess surface 490. O-ring recess 486 has an o-ring recess diameter 492, measured parallel to coupling surface 456, and an o-ring recess depth 494, measured perpendicular to coupling surface 456 and between coupling surface 456 and o-ring recess surface 490. O-ring recess 486 is sized to house a cap o-ring 496 when cap 450 is rigidly coupled to frame 100. For purpose of example, for valve embodiment 40 o-ring 496 may be a VITON o-ring, V747-75,cap recess diameter 492 is about 0.47 inches, and cap recess depth is about 0.06 inches.

Contact surface 466, together with cap flanges 462 and 464 (cap flange 464, not illustrated in FIG. 3, substantially mirrors cap flange 462 about cross-section A—A), define a receiving slot 460. Receiving slot 460 is configured to receive a portion of knob 500 between contact surface 466 and cap flanges 462 and 464. Cap flange 462 includes cap flange surface 468 facing, and preferably parallel to, contact surface 466. Slot side wall 472 connects contact surface 466 to cap flange surface 468, and is substantially perpendicular to contact surface 466 and cap side surface 492. Cap flange 462 further includes cap gap surface 474. Cap gap surface 474 is preferably substantially parallel to slot side wall 472 and faces cap flange 464.

Slot length 470 is the distance between, and perpendicular to, contact surface 466 and cap flange surface 468. Slot half-width 476 is the distance between slot side wall 472 and cap axis 498, measured perpendicular to cap axis 498. Gap half-width 478 is the distance between cap gap surface 474 and cap axis 498, measured perpendicular to cap axis 498. For purpose of example, an appropriate slot height 470, slot half-width 476, and gap half-width 478 for valve embodiment 40, is about 0.12 inches, about 0.39, and about 0.26 respectively.

Coupling flange 510 extends away from cap axis 498 along coupling surface 456 between side surfaces 492 and 494. A substantially cylindrical hole 512, oriented substantially parallel to cap axis 498, extends through coupling flange 510. Hole 512 is located substantially midway between cap side surfaces 492 and 494. Distance 514 is measured between the center of hole 512 and cap axis 498, and perpendicular to cap axis 498. A second coupling flange 510 and hole 512 (not illustrated in FIG. 4) mirror coupling flange 510 and hole 512 about line A—A. Distance 514 is preferably about equal to distance 153, so as to align holes 512 of cap 450 with holes 152 of frame 100.

Knurled knob 500 includes a substantially cylindrical coupling flange 520 and substantially cylindrical grip 540, connected by a substantially cylindrical knob shaft 530. Coupling flange 520, knob shaft 530, and grip 540 are co-centric about knob axis 502, and have respective diameters 522, 532, and 542 (measured perpendicular to knob shaft 530). Coupling flange 520, knob shaft 530, and grip 540 have substantially cylindrical side walls 524, 534, and 544, respectively. Coupling flange 520 further has a minor contact surface 526 connecting flange side wall 524 and shaft side wall 534, and a major contact surface 528 opposite minor contact surface 526. Minor contact surface 526 and major contact surface 528 are substantially flat and perpendicular to knob axis 502. Grip side wall 544 includes a diamond-knurl pattern for better gripping. Knob bore 504 extends entirely through knob 500 along knob axis 502. Knob bore 504 has a knob bore diameter 506 measured perpendicular to knob axis 502 and a knob bore wall 508. Knob bore diameter 506 is about equal to cap diameter 482, and knob bore wall 508 is threaded along a least a portion of its length to receive the threaded end of valve shaft 400. Knob axis 502 is oriented and positioned to align with cap axis 498 when knob 500 is rotatably engaged to cap 450.

Flange distance 529 is measured between minor and major contact surfaces 526 and 528, and perpendicular to knob axis 502. To rotatably engage knob 500 to valve cap 450, coupling flange 520 is inserted, along a direction perpendicular to cap side surface 492, into receiving slot 460 (i.e. between flanges 462 and 464 and contact surface 466). To ensure easy rotation of knob 500 about knob axis 502 when rotatably coupled to shaft cap 450, flange distance 529 is preferably slightly less than slot length 470, coupling flange diameter 522 is slightly less than twice slot half-width 476, and knob shaft diameter 532 is slightly less than twice gap half-width 478.

Figure 5:
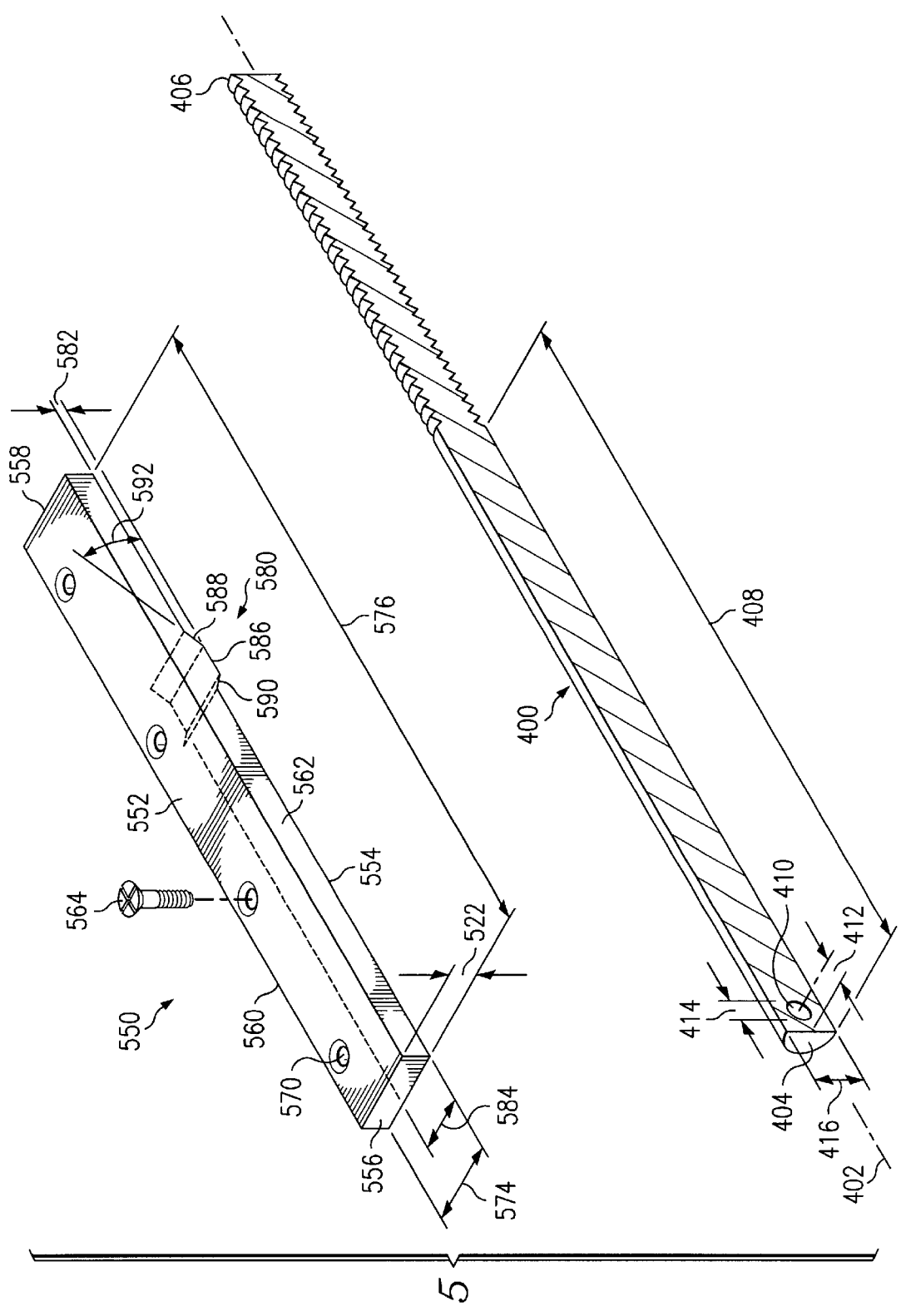
FIG. 5 provides a forward perspective cross-sectional view of valve shaft 400 and first clamp 550 of the embodiment of FIG. 2 taken along line A—A of FIG. 2.

FIG. 5 provides a forward perspective cross-sectional view of valve shaft 400 and first clamp 550 of the embodiment of FIG. 2 taken along line A—A of FIG. 2. Valve shaft 400 is substantially cylindrical in configuration, having a central shaft axis 402, and a shaft diameter 416 measured perpendicular to shaft axis 402. Shaft 400 has a first end 404 and a second end 406. Shaft 400 terminates in opposite ends 402 and 404. Ends 404 and 406 are substantially flat and perpendicular to shaft axis 402. Shaft 400 is smooth along a length 408 from first end 404. The remainder of shaft 400 is threaded for engagement to knob 500. Shaft 400 has a pin bore 410 passing through, and perpendicular to, shaft axis 402. Pin bore 410 is a distance 412 from first end 404, and has a bore diameter 414. Pin bore 410 is used to engage shaft 400 to slide 200.

Shaft diameter 416 is preferably slightly smaller than frame bore 150 to allow easy movement of shaft 400 along slide axis 90 when valve 40 is assembled as illustrated in FIG. 2. Length 408 of shaft 400 is controlled to ensure that, when valve 40 is assembled and in the open first position, o-ring 496 contacts shaft 400 along smooth length 408, and no portion of smooth length 408 extends beyond contact surface 466 of cap 450. For example, pin bore diameter 414 for valve embodiment 40 is about 0.07 inches.

First clamp 550 is substantially rectangular in configuration, having a parallel first and second surfaces 552 and 554. Parallel end walls 556 and 558, and first and second side walls 560 and 562, are each perpendicular to first and second surfaces 552 and 554. Clamp depth 572, is measured between, and perpendicular to, first and second surfaces 552 and 554. Clamp width 574, is measured between, and perpendicular to, first and second end walls 560 and 562. Clamp length 576, is measured between, and perpendicular to, end walls 556 and 558. To fit first clamp 550 within recess 160 and maintain a smooth up-beam side 44, clamp depth 572 is preferably about equal to recess depth 172, clamp length 576 is about equal to recess length 176. For example, clamp width 574 for valve embodiment 40 is about 0.56 inches.

Four substantially cylindrical holes 570, extend through first clamp 550, between and perpendicular to first and second surfaces 552 and 554. The location of holes 570 relative to first side wall 560 substantially correspond to the location of holes 170 relative to recess side wall 162, so that screws 564 extending through holes 570 and into holes 170 may lock first clamp 550 within recess 160. Screws 564 are preferably counter-sunk flat headed screws to help maintain a smooth up-beam side 44 of valve 40. Holes 570 are preferably threaded and include screw head to receive the heads of screws 564. For example, screws 564 for valve embodiment 40 may be #6-32 hexagon socket flat countersunk head cap screws, and holes 570 are threaded and include screw head recesses appropriate for receiving such screws 564.

Second surface 554 includes a clamp detent 580. Clamp detent 580 extends from second surface 554 and away from first surface 552 a detent height 582, measured perpendicular to second surface 554. Clamp detent 580 preferably also extends from second side wall 562 a detent width 584 toward first side wall 560. Detent width 584 is preferably limited so that the sum of detent width 584 and twice recess width 174 is less than clamp width 574, thereby preventing clamp detent 580 from being located between second surface 554 and recess surface 168 when first clamp 550 is engaged to frame 100 within recess 160. Clamp detent 580 includes a substantially rectangular clamp contact surface 586 and substantially rectangular inclines 588 and 590 connecting opposite sides of clamp contact surface 586 to second surface 554 along a line parallel to second side wall 562 and second surface 554. Clamp contact surface 586 is substantially parallel to second surface 554, and has a contact surface length 594 measured perpendicular to end wall 566. Inclines 588 and 590 intersect second surface 554 at an incline angle 592. Clamp detent 580 is preferably located on second surface 554 so that, when first clamp 550 is engaged to frame 100 within recess 160, the center of clamp contact surface 586 is located on a plane perpendicular to slide axis 90 and through central axis 142 of frame orifice 140 as illustrated in FIG. 2.

For example, detent width 584, detent height 582, contact surface length 594 and incline angle 592, for valve embodiment 40, are about 0.23 inches, about 0.03 inches, about 0.25 inches, and about 15 degrees respectively. Second clamp 600 has a second clamp detent 640, and is substantially similar to, and substantially mirrors first clamp 550 about line A—A (as illustrated in FIG. 2).

It should be understood that while the instant invention preferably utilizes two clamps 550 and 600 to secure slide 200 within slide slot 120, and to bias slide 200 toward slide slot surface 130, the invention may also utilize only a single clamp. Further, though slide 200 is preferably clamped to maintain slide 200 within slide slot 120, clamping of shaft 400 may achieve a similar purpose. In addition, though clamps 550 and 600 are shown as separate components of valve 40 distinct from frame 100, clamps 550 and 600 may be an integral portion of frame 100.

Figure 6:
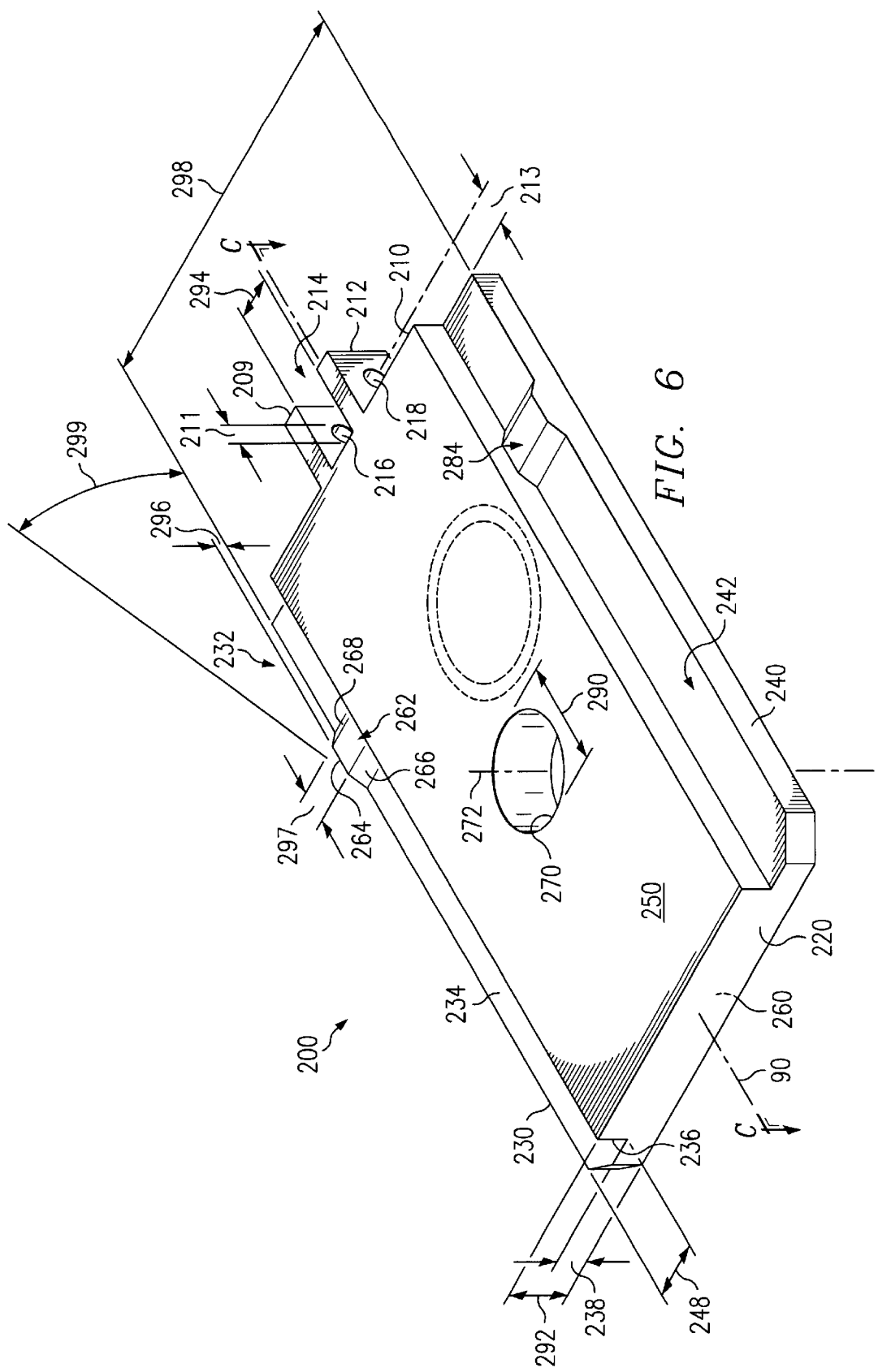
FIG. 6 provides a forward perspective view of slide 200 of the embodiment of FIG. 2.

FIG. 6 provides a forward perspective view of slide 200. Slide 200 is substantially rectangular in configuration and has substantially parallel engagement end wall 210 and distal end wall 220, substantially parallel outer surface 250 and inner surface 260, and a first side 230 and a second side 240 substantially parallel to a slide axis 90 and perpendicular to outer surface 250. A slide orifice 270 extends between outer and inner surfaces 250 and 260. Slide orifice 270 is cylindrical in configuration and has a central axis 272 substantially perpendicular to outer and inner surfaces 250 and 260. Slide orifice 270 has a slide orifice diameter 290 measured perpendicular to central axis 272. Slide orifice 270 may also be substantially conical in configuration, having a lesser diameter equal to the greater diameter 144 of frame orifice 140, for reasons similar to those justifying the preferred conical configuration of frame orifice 140. Slide orifice 270 should be positioned on slide 200 so that when slide 200 is in the open position a particle beam generated by particle accelerator system 10 and extending through valve 60 will be substantially co-linear with central axis 272. Slide orifice 270 is preferably located approximately midway between first side 230 and second side 240.

Slide thickness 292 is measured between, and perpendicular to, inner and outer surfaces 560 and 550. Slide width 298 is measured between, and perpendicular to, first side 230 and second side 240. Slide width 298 is preferably slightly smaller than twice slide slot half-width 134, and slide thickness 292 is preferably slightly smaller than slide slot depth 132, to provide relatively easy movement of slide 200 within slide slot 120 between the first open position and the second closed position along slide axis 90. For example, slide orifice diameter 290, slide thickness 292, and slide width 298, in valve 40, are about 0.38 inches, about 0.40 inches, and about 1.56 inches respectively.

Two substantially rectangular engagement flanges 209 and 212 extend away from engagement end 210 in a direction substantially parallel to slide axis 90. A shaft slot 214 having a slot length 294 is thereby formed between flanges 209 and 212 for receiving end 404 of valve shaft 400 (as illustrated in FIG. 2). Substantially cylindrical and co-linear pin bores 216 and 218 extend through flanges 209 and 212 respectively, in a direction perpendicular to slide axis 90 and parallel to first side 230. Pin bores 216 and 218 have diameters 211, measured perpendicular to slide axis 90, and about equal to diameter 414 of shaft pin bore 410. Pin bores 216 and 218 are a distance 213 from engagement end wall 210. The intersection of flanges 209 and 212 to engagement end 210 may be rounded as illustrated.

First engagement recess 232 extends along the intersection of outer surface 250 and first side 230, from engagement end wall 210 to distal end wall 220. First recess 232 is defined by a first recess surface 234 and a first recess wall 236. First recess surface 234 is substantially parallel to outer surface 250, and first recess wall 236 is substantially parallel to first side wall 230. Recess depth 238 is the distance measured between, and perpendicular to, outer surface 250 and first recess surfaces 234. Recess width 248 is measured between, and perpendicular to, first side wall 230 and first recess wall 236. The sum of recess width 248 and recess width 174 is preferably slightly greater than clamp width 574, to permit first clamp 550 to reside within first clamp recess 160 and first recess 232 when valve 40 is assembled as illustrated in FIG. 2. For example, recess depth 238 and recess width 248, for valve embodiment 40, are about 0.146 inches and 0.5 inches respectively.

First detent 262 extends from first recess surface 234 and away from inner surface 260 a detent height 296 measured perpendicular to first recess surface 234, and preferably also extends between first side wall 230 and first recess wall 236. First detent 262 includes a substantially rectangular first contact surface 264 and substantially rectangular inclines 266 and 268 connecting opposite sides of first contact surface 264 to first recess surface 234 along slide axis 90. First contact surface 264 is substantially parallel to outer surface 250, and has a contact surface length 297 measured perpendicular to distal end wall 220. Inclines 266 and 268 intersect first recess surface 234 at an incline angle 299. The center of first contact surface 264 is located on a line perpendicular to slide axis 90 and through central axis 272. Detent height 296, contact surface length 297, and incline angel 299, are preferably about equal to detent height 582, contact surface length 594 and incline angle 592, of clamp detent 580.

Second engagement recess 242, having second detent 284, extends along the intersection of outer surface 250 and second 240 in manner substantially similar to and mirroring (about line B—B of FIG. 2) first engagement recess 232.

Figure 7:
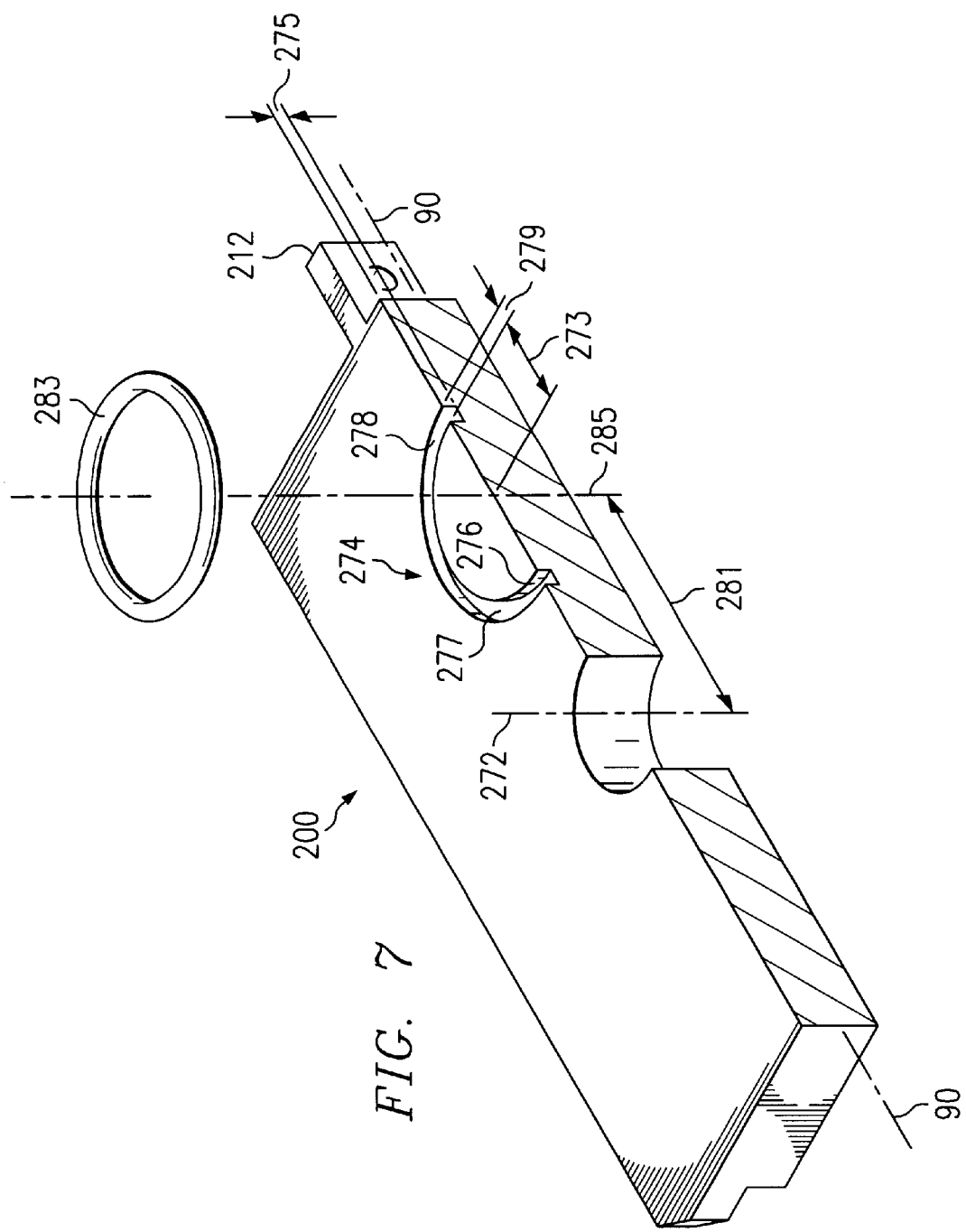
FIG. 7 provides a rear perspective cross-sectional view of slide 200 of the embodiment of FIG. 6 taken along line C—C of FIG. 6 and illustrating o-ring slot 274.

FIG. 7 provides a rear perspective cross-sectional view of slide 200 of the embodiment of FIG. 6 taken along line C—C of FIG. 6 and illustrating o-ring slot 274. O-ring slot 274 is substantially annular in configuration and substantially rectangular in cross-section. O-ring slot 274 is defined by o-ring surface 277 and by substantially concentric and cylindrical inner wall 276 and outer wall 278, which have a central axis 285. O-ring slot depth 275 is measured between, and perpendicular to, substantially parallel o-ring slot surface 277 and inner surface 260. O-ring slot radius 273 is measured between central axis 285 and inner wall 276, and perpendicular to central axis 285. O-ring slot width 279 is measured between inner wall 276 and outer wall 278, and perpendicular to central axis 285.

O-ring slot 274 is centered along slide axis 90. Distance 281 is the distance between central axis 285 and central axis 272, measured perpendicular to central axis 285. Distance 281 should be sized to prevent interference between o-ring slot 274 and slide orifice 270, and to permit movement of slide 200 within slide slot 120 between the first open position and the second closed position. Generally, o-ring slot 274 is sized to house a seal, preferably an o-ring 283, for forming a seal with inner surface 260 across frame orifice 140 when slide 200 is in the second closed position. A portion of o-ring 283 should extend out of o-ring slot 274 beyond inner surface 260 to contact slide slot surface 130 when slide 200 is in the second closed position. O-ring 283 for valve 40 may be a VITON o-ring, V747-75. For example, o-ring depth 275, o-ring slot radius 273, o-ring slot width 279, and distance 281, for the embodiment of valve 40 illustrated, are about 0.11 inches, 0.43 inches, 0.16 inches, and 0.87 inches respectively.

Figure 8:
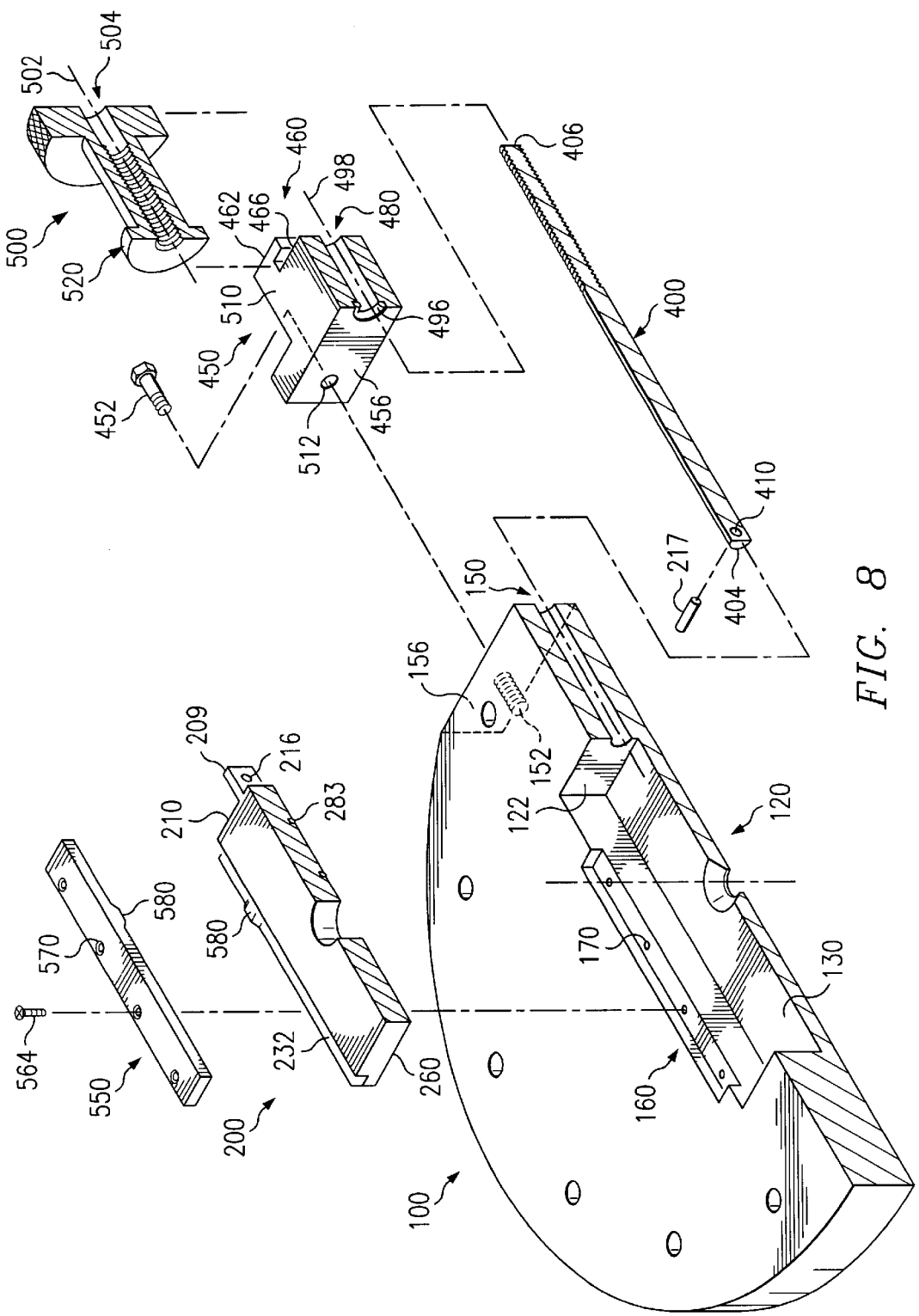
FIG. 8 provides a forward perspective disassembled cross-sectional view of the embodiment of FIG. 2, taken along line A—A of FIG. 2, and illustrating the assembly of valve 40.

FIG. 8 provides a forward perspective disassembled cross-sectional view of the embodiment of FIG. 2, taken along line A—A of FIG. 2, illustrating the assembly of valve 40. Coupling flange 520 of knob 500 is inserted, along a direction perpendicular to cap side surface 492, into receiving slot 460 between contact surface 466 and cap flanges 462 and 464 (not illustrated in FIG. 8). Knob axis 502 is thereby aligned with cap axis 498. Threaded second end 406 of valve shaft 400 is inserted through cap bore 480, and into knob bore 504. Knob 500 is rotated about knob axis 502 to pull valve shaft 400 through knob bore 504 until secured.

Slide 200, housing o-ring 283, is inserted into slide slot 120 of frame 100 with inner surface 260 of slide 200 toward slide slot surface 130 of frame 100, and with slide end wall 210 toward slide slot end wall 122. First end 404 of valve shaft 400 is inserted through frame bore 150, into slide slot 120, and between engagement flanges 209 and 212 (as shown in FIG. 2), until pin bores 216 and 218 (not illustrated in FIG. 8) of flanges 209 and 212 align with pin bore 410 of valve shaft 400. A pin 217 is then inserted through pin bores 216, 218 and 410 to secure slide 200 to shaft 400.

Knob 500, housing o-ring 496, is then rotated about knob axis 502 until coupling surface 156 of frame 100 contacts coupling surface 456 of valve cap 450. Valve cap 450 is then rotated about cap axis 498 until holes 512 of valve cap 450 align with holes 152 (illustrated by broken of frame 100. Screws 452 and 454 (not illustrated in FIG. 8) are then inserted through holes 512 and screwed into holes 152 to secure cap 450 and knob 500 to frame 100. O-ring 496 creates a seal between cap 450 and frame 100, and between cap 450 and shaft 400, to prevent atmosphere leakage into the interior volume of particle accelerator system 10 through frame bore 150.

First clamp 550 is then positioned within first clamp recess 160 and first recess 232, and second clamp 600 (not illustrated in FIG. 8) is positioned within second clamp recess 180 and second recess 142, so that first and second clamp detents 580 and 640 (not illustrated in FIG. 8) face toward and contact slide 200. Screws 564 are then inserted through holes 570 of first and second clamps 550 and 600, and screwed into holes 170. First and second clamps 550 and 560 are thereby secured to first and second recesses 160 and 180 respectively, and slide 200 is secured within slide slot 120.

Knob 500 and cap 450 comprise one specific type of valve control mechanism, and serve to move slide 200 (via shaft 400) from a first open position to a second closed position. However, it must be understood that this invention is not limited to one particular form of valve control mechanism, and that other valve control mechanism are equally acceptable. Further, valve 40 need not incorporate any valve control mechanism. For example, the position of shaft 400 extending from frame 100 may be manually adjusted through direct hand manipulation of shaft 400. Others acceptable valve control mechanisms include, but are not limited to: hydraulic actuators, pneumatic actuators, electric motors, or a combination thereof. Valve control mechanisms utilized by valve 40 may also be either manually or automatically operated. It should also be understood that shaft 400 and slide 200 may or may not be integrally coupled, and that shaft 400 may constitute a portion of slide 200.

FIGS. 9A and 9B provide cross-sectional side views of a portion of valve 40 taken along line B—B of FIG. 2. In both illustrations, slide 200 is shown within slide slot 120 of frame 100, between slide slot surface 130 and second clamp 600.

FIG. 9A illustrates slide 200 in the second closed position, in which second clamp detent 640 engages second slide detent 284 and central axis 142 of frame orifice 140 substantially aligns with central axis 285 of seal slot 274. Slide 200 is thereby forced against slide slot surface 300, thus compressing o-ring 283 to form a seal, in conjunction with slide 200, around frame orifice 140. It is preferred that detents 284 and 640, and opposite detents 262 and 580 (not illustrated in FIG. 9A), are positioned on a plane perpendicular to slide axis 90, to more effectively align the force applied to slide 200 by second clamp 200 with the interface between o-ring 283 and slide slot surface 130.

FIG. 9B illustrates slide 200 in the first open position, in which second clamp detent 640 is not engaged to second slide detent 284, and in which central axis 142 of frame orifice 140 substantially aligns with central axis 272 of frame orifice 270, thereby permitting a particle beam to pass through valve 40 along beam line 5. In the first position, first surface 652 of second clamp 600 (corresponding to opposite first surface 552 of first clamp 550 as illustrated in FIG. 5), first surface 552 of first clamp 550 (not illustrated in FIG. 9B), outer surface 250 of slide 200, and first surface 110 of frame 100, advantageously form a substantially flat surface 45 on up-beam surface 44 of valve 40. As illustrated, down-beam surface 42 of valve 40 consists solely of second surface 112 of frame 100, and is substantially flat.

In the embodiment illustrated flat surface 45 is limited by the extent of overlap between slide 200 and first and second clamps 550 and 600, in a direction parallel to beam line 5. A cavity 46 is defined in up-beam surface 44 between second and first clamps 600 and 550 (not illustrated in FIG. 9B) and between distal end wall 220 of slide 200 and slot end wall 124 of frame 100. A cavity 48 is defined in up-beam surface 44 between slot end wall 122 of frame 100, and clamp end walls 658 of second clamp 600 and 558 of first clamp 550 (not illustrated in FIG. 9B).

Cavities 46 and 48 are preferably limited in size and remote from beam line 5. The size of cavities 46 and 48 may be limited by having slide slot length 136 (measured along slide axis 90) only slightly exceed the sum of slide length 291 (measured along slide 90 and including flange 212) and distance 281 between central axis 285 and central axis 272, as illustrated. The size of cavities 46 and 48 may further be reduced by having a recess (not illustrated) in slot end wall 122 for receiving flanges 212 and 209, and by having clamp length 576 about equal to slide slot length 291.

Cavities 46 and 48 may be located more remotely from beam line 5 by increasing slide slot length 136, clamp length 576, and slide length 291. If possible, it is preferred that cavities 46 and 48 be located a sufficient distance from frame aperture 140 so that, when a particle accelerator system 10 component is coupled to up-beam surface 44 of valve 40, flat surface 45 extends beyond the limits of the exit aperture of that particle accelerator system 10 component.

In any event, the valve 40 of the instant invention provides flat surface 45 superior to the sealing surface of the Swenson valve in that flat surface 45 is perpendicular to beam line 45, and thus less likely to detrimentally distort electric or magnetic fields within adjacent particle accelerator system 10 components, while the sealing surface of the Swenson valve is not parallel to beam line 5 even in the immediate vicinity of the Swenson valve's aperture. In addition, cavities exist in the down-beam surface of the Swenson valve immediately adjacent to the Swenson valve's sealing surface.

O-ring 283 preferably biases slide 200 toward second clamp 600, forcing detent 640 against second recess surface 286 (corresponding to opposite first recess surface 234 as illustrated in FIG. 6) and detent 284 against second surface 654 (corresponding to second surface 554 of first clamp 550 as illustrated in FIG. 5) of second clamp 600, to prevent unwanted movement of slide 200 along beam line 5.

In the illustrated embodiment of FIGS. 9A and 9B, slide 200 is moved between the first and second position through the manipulation of shaft 400 by the combination (not illustrated in FIGS. 9A and 9B) of valve cap 450 and knurled knob 500. The instant invention advantageously provides a reduction in friction between o-ring 283 and slide slot surface 130, during movement of slide 200 between the first and second positions, without the use of the canted sealing surface of the Swenson valve. The reduction in friction between o-ring 283 and slide slot surface 130 during this range of movement is realized by isolating the increased sealing bias of slide 200 toward slide slot surface 230 to the immediate vicinity of the second position, where slide detents 262 and 284 engage clamp detents 580 and 640. A lesser bias, if any, is experienced by slide 200 during the remainder of this range of movement (i.e. when detents 262 and 284 do not align with detents 580 and 640), thereby resulting in decreased friction between o-ring 283 and slide slot surface 130 during the remainder of the range of movement.

Up-beam surface 44 (the surface of valve 40 having slide slot 120) is preferably oriented toward LEBT 30 of particle accelerator system 10, as the atmospheric pressure within RFQ 50 is typically lower during operation than the atmospheric pressure within LEBT 30. However, it should be understood that while it is preferred that up-beam surface 44 be oriented toward the adjacent particle accelerator system 10 component having the lower internal atmospheric pressure during operation, up-beam surface 44 may also be oriented toward the adjacent particle accelerator system 10 component having the higher internal atmospheric pressure during operation.

Figure 10B:
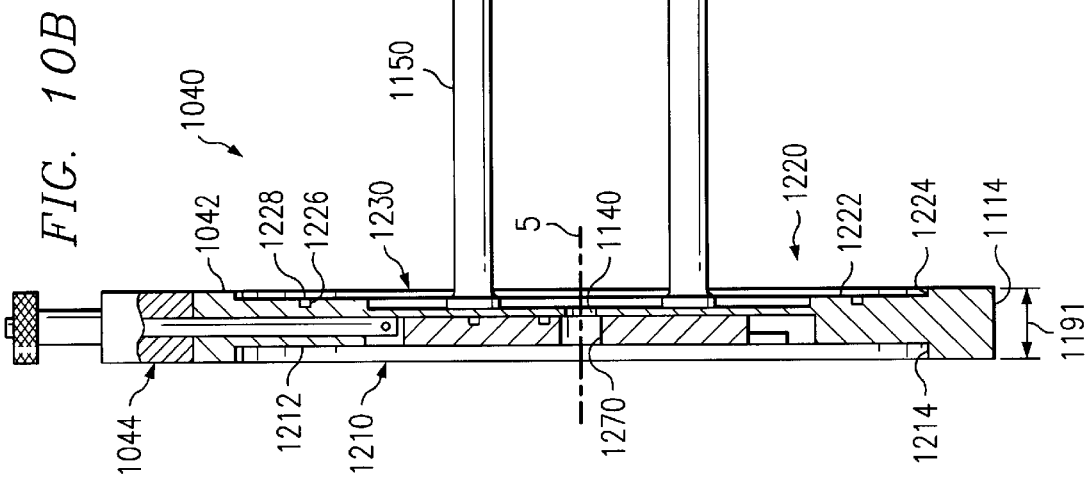
FIG. 10B provides a side cross-sectional view of the embodiment of FIG. 10A taken along line D—D of FIG. 10A.
Figure 10A:
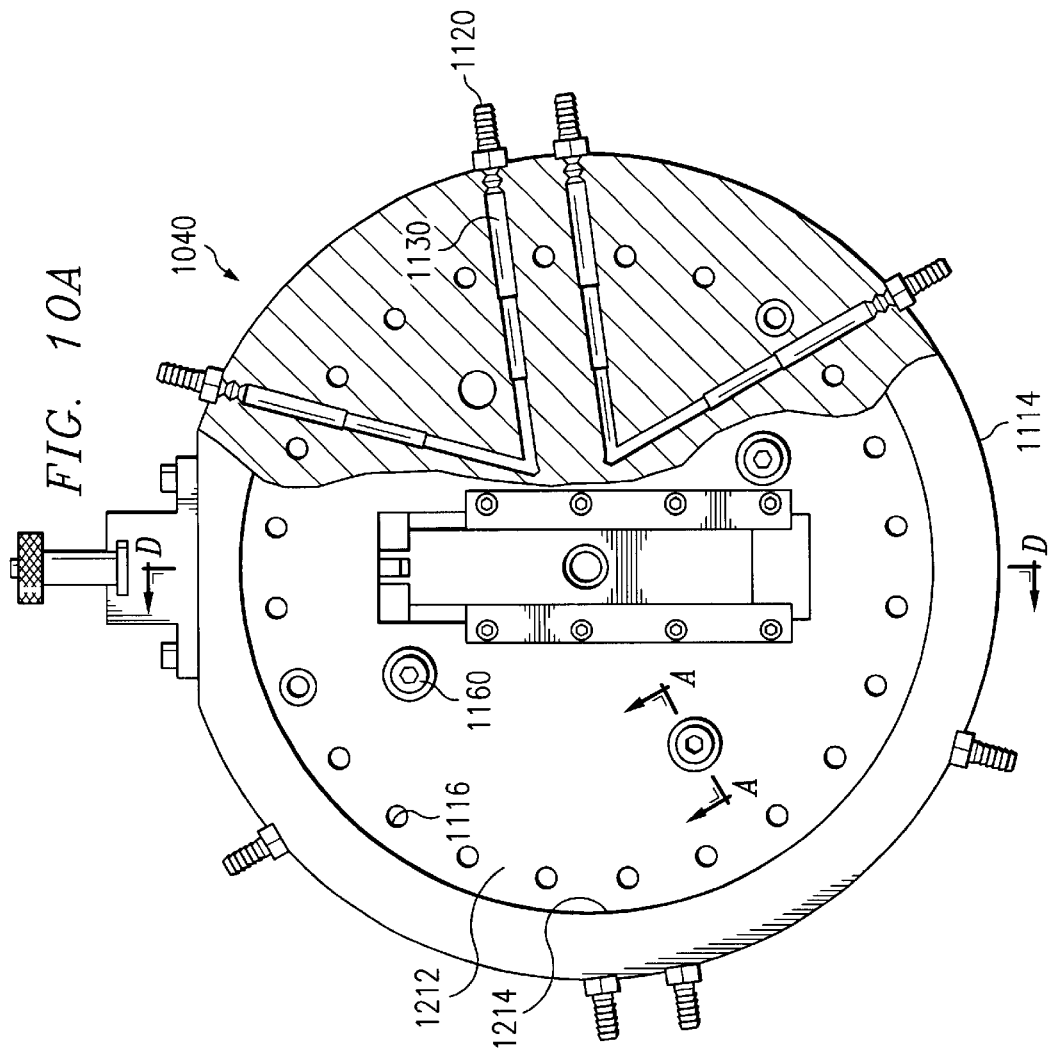
FIG. 10A provides a forward orthogonal view of an alternate embodiment of the valve of the instant invention.

FIGS. 10A and 10B illustrate an alternate embodiment of the valve of the instant invention, in which the end plate 1040 of RFQ 1050 acts as a thin beam-line vacuum valve. FIG. 10A proves a front orthogonal view of end plate 1040, and FIG. 10B provides a side cross-sectional view of the embodiment of FIG. 10A taken along line D—D of FIG. 10A.

Securement apertures 1116, together with securement bolts (not illustrated), connect end plate 1040 to RFQ 1050 and the particle beam system 10 component immediately up-beam (e.g. LEBT 30). Substantial heat may be generated by RFQ 1050 during operation. To provide cooling of end plate 1040 during operation of RFQ 1050, hose connectors 1120 extend from outer plate wall 1114 for engagement to fluid cooling system. Hose connectors 1120 communicate with internal cooling channels 1130, located within end plate 1040. Tuning rods 1150 extend perpendicularly from down-beam surface 1042 into the interior volume of RFQ 1050. Tuning holes with plugs 1160 extend through end plate 1040.

Plate thickness 1191, measured between and perpendicular to up-beam surface 1044 and down-beam surface 1042, is substantially larger than frame thickness 191 of the embodiment 40 of FIG. 3, due in part to the need to accommodate cooling channels 1130 within end plate 1040. Plate thickness 1191 is preferably equal to or less than 1 inch. Upstream surface 1044 of end plate 1040 includes a substantially cylindrical up-beam recess 1210, substantially concentric with beam line 5 and defined by an up-beam recess surface 1212 and an up-beam recess wall 1214. Up-beam recess 1210 substantially conforms in shape to and receives an end of an adjacent particle accelerator 10 component immediately up-beam from RFQ 1050. The end of the adjacent particle accelerator 10 component is coupled to and seals against up-beam recess wall surface 1212.

Down-beam surface 1042 of end plate 1040 includes a substantially cylindrical down-beam recess 1220, substantially concentric with beam line 5 and defined by a down-beam recess surface 1222 and down-beam recess wall 1224. Down-beam recess 1020 substantially conforms in shape to and receives an end of the main body of RFQ 1050. Down-beam recess 1220 houses an o-ring 1226 in an o-ring slot 1228. O-ring 1226 and o-ring slot 1228 are located on plates substantially perpendicular to beam line 5. The main body of RFQ 1050 is coupled to and seals against, with the aid of o-ring 1226, down-stream recess surface 1224. Down-beam recess 1220 contains a second down-beam recess 1230 having an outer perimeter 1235 substantially conforming to the interior volume of RFQ 1050.

Plate 1040 utilizes a plate orifice 1140 and slide orifice 1270 having substantially conical configurations. Downbeam recess surface 1222 is preferably plated with, and slide 1200 is preferably constructed from, oxygen free high purity copper.

While a preferred embodiment of the thin beam-line cuum valve has been described in detail herein, it should be apparent that modifications and variations thereto are possible, all of which fall within the true spirit and scope of the invention.

We claim:

1. A vacuum valve for use in a particle accelerator system between two adjacent particle accelerator system components and along the beam line generated by said particle accelerator system, the valve comprising:

a frame having a slide axis, first and second surfaces respectively facing toward said two adjacent particle accelerator system components, and an outer frame wall between said first and second surfaces, said first surface of said frame including a slide slot having a slot surface and a frame orifice extending through said frame between said slot surface and said second surface, wherein said frame orifice is positioned and sized in said frame to permit passage of a particle beam generated by said particle accelerator system along said beam line;

a slide having a slide orifice, an outer surface and an inner sealing surface, said slide being housed substantially within the slide slot and being movable between a first position and a second position along a slide axis, said slide in said first position permitting a particle beam to pass through said slide orifice and through said frame orifice along said beam line, said slide in said second position preventing a particle beam from passing through said frame aperture, wherein said inner sealing surface of said slide engages said slot surface of said frame to substantially seal said frame orifice when said slide is in said second position; and a shaft translatable relative to said frame in a direction substantially parallel to said slide axis, said shaft extending from said slide in a direction substantially perpendicular to said slide axis and toward said outer frame wall, wherein translation of said shaft selectively controls the movement of said slide between said first and second positions;

wherein said outer surface of said slide and said first surface of said frame form a substantially flat surface substantially perpendicular to said beam line and surrounding said slide orifice, and wherein said second surface of said frame forms a substantially flat surface substantially perpendicular to said beam line and surrounding said frame orifice.

2. The vacuum valve of claim 1 wherein said valve further comprises a clamp having an inner clamp surface, said inner clamp surface engaging said slide and maintaining said slide substantially within said slide slot.

3. The vacuum valve of claim 2 wherein said outer surface of said slide has a clamp recess extending substantially parallel to said slide axis, said inner surface of said clamp engaging said slide along said clamp recess, and wherein said clamp has an outer clamp surface, said flat surface substantially perpendicular to said beam line being further formed by said outer clamp surface.

4. The vacuum valve of claim 3 wherein said clamp is not formed as an integral component of said frame, and is a discrete component of said valve attached to said frame 5. The vacuum valve of claim 4 wherein said first surface of said frame has a frame recess adjacent to said slide slot, said clamp being located in said frame recess when attached to said frame.

6. The vacuum valve of claim 5 wherein said clamp is secured within said frame recess to said frame by a clamp screw extending through said clamp and into said frame, said frame recess and said clamp having screw holes to receive said clamp screw.

7. The vacuum valve of claim 6 wherein said clamp screw is a counter-sunk flat-head screw, and said screw hole in said clamp has a recess to receive said head of said clamp screw.

8. The vacuum valve of claim 2 wherein said slide has a slide detent extending toward said clamp and said clamp has a clamp detent extending toward said slide, said clamp detent and said slide detent being position to engage one another when said slide is moved from said first position to said second position and thereby bias said inner surface of said slide toward said frame orifice and against said slot surface to substantially seal said frame orifice when said slide is in said second position.

9. The vacuum valve of claim 8 wherein said clamp detent and said slide detent, when said slide is in said second position, are substantially positioned on a plane substantially perpendicular to said slide axis and passing substantially through said beam line.

10. The vacuum valve of claim 8 wherein said inner surface of said slide has a seal positioned to engage said slide slot surface around said frame orifice, and to substantially seal said frame orifice when said slide is in said second position.

11. The vacuum valve of claim 10 wherein said seal is an o-ring constructed of an elastomeric material.

12. The vacuum valve of claim 1 wherein the frame thickness, measured between and perpendicular to said first surface and said second surface of said valve, is not more than 0.5 inches.

13. The vacuum valve of claim 1 wherein said frame includes a plurality of securement apertures extending through said frame between, and substantially perpendicular to, said first and second surfaces of said frame, said securement apertures being utilized to couple said valve to said adjacent particle accelerator components.

14. The vacuum valve of claim 1 wherein said valve further includes a valve control mechanism, said valve control mechanism controlling the translation of said shaft relative to said frame in the direction substantially parallel to said slide axis, and thereby controlling the movement of said slide between said first and second positions.

15. The vacuum valve of claim 14 wherein said valve control mechanism comprises a valve cap and a knob, said cap and said knob having a cap orifice and a knob orifice respectively, said shaft terminating in a threaded end and extending through said outer frame wall and said cap orifice, and into said knob orifice, said cap engaging said outer frame wall along a coupling surface and securing the position of said knob in the direction substantially parallel to said slide axis, while permitting the rotation of said knob about a knob axis parallel to said slide axis, said knob orifice being threaded and engaging said threaded end of said shaft, so that the rotation of said knob about said knob axis controls the position of said shaft relative to said frame in a direction substantially parallel to said slide axis.

16. The vacuum valve of claim 1 wherein said slide and said frame are constructed from a highly electrically conductive material.

17. The vacuum valve of claim 1 wherein said slide and said frame are constructed from oxygen free high purity copper.

18. The vacuum valve of claim 1 wherein said valve further includes a valve control mechanism, said valve control mechanism controlling the translation of said shaft relative to said frame in the direction substantially parallel to said slide axis, and thereby controlling the movement of said slide between said first and second positions.

19. The vacuum valve of claim 18 wherein said valve control mechanism comprises a valve cap and a knob, said cap and said knob having a cap orifice and a knob orifice respectively, said shaft terminating in a threaded end and extending through said outer frame wall and said cap orifice, and into said knob orifice, said cap engaging said outer frame wall along a coupling surface and securing the position of said knob in the direction substantially parallel to said slide axis, while permitting the rotation of said knob about a knob axis parallel to said slide axis, said knob orifice being threaded and engaging said threaded end of said shaft, so that the rotation of said knob about said knob axis controls the position of said shaft relative to said frame in a direction substantially parallel to said slide axis.

20. A vacuum valve for use in a particle accelerator system between two adjacent particle accelerator system components and along the beam line generated by said particle accelerator system, the valve comprising:

a frame having a slide axis, first and second surfaces respectively facing toward said two adjacent particle accelerator system components, and an outer frame wall between said first and second surfaces, said first surface of said frame including a slide slot having a slot surface and a frame orifice extending through said frame between said slot surface and said second surface, wherein said frame orifice is positioned and sized in said frame to permit passage of a particle beam generated by said particle accelerator system along said beam line;

a slide having a slide orifice, an outer surface and an inner sealing surface, said slide being housed substantially within the slide slot and movable between a first position and a second position along a slide axis, said slide in said first position permitting a particle beam to pass through said slide orifice and through said frame orifice along said beam line, said slide in said second position preventing a particle beam from passing through said frame aperture, wherein said inner sealing surface of said slide engages said slot surface of said frame to substantially seal said frame orifice when said slide is in said second position;

a shaft translatable relative to said frame in a direction substantially parallel to said slide axis, said shaft extending from said slide in a direction substantially perpendicular to said slide axis and toward said outer frame wall, wherein translation of said shaft selectively controls the movement of said slide between said first and second positions;

a first clamp having a first inner clamp surface and an outer first clamp surface, said first inner clamp surface engaging a first side of said slide and maintaining said slide substantially within said slide slot; and a second clamp having a second inner clamp surface and an outer second clamp surface, said second inner clamp surface engaging a second side of said slide substantially opposite the side of said slide contacted by said first inner clamp surface, and maintaining said slide substantially within said slide slot;

wherein said slide has a first slide detent extending toward said first clamp and a second slide detent extending toward said second clamp, said first clamp has a first clamp detent extending toward said slide, and said second clamp has a second clamp detent extending toward said slide, said first clamp detent being positioned to engage said first slide detent, and said second clamp detent being positioned to engage said second slide detent, when said slide is moved from said first position to said second position, to thereby bias said inner surface of said slide toward said frame orifice and against said slot surface to substantially seal said frame orifice when said slide is in said second position.

21. The vacuum valve of claim 20 wherein said outer surface of said slide, said outer first clamp surface, said outer second clamp surface, and said first surface of said frame form a substantially flat surface substantially perpendicular to said beam line and surrounding said slide orifice, and wherein said second surface of said frame forms a substantially flat surface substantially perpendicular to said beam line and surrounding said frame orifice.

22. The vacuum valve of claim 20 wherein said outer surface of said slide has first and second clamp recesses and a second clamp recess extending substantially parallel to said slide axis, said inner surfaces of said first and second clamps engaging said slide along said first and second clamp recess respectively.

23. The vacuum valve of claim 22 wherein said first and second clamps are not formed as an integral component of said frame, and are discrete components of said valve attached to said frame, and wherein said first surface of said frame has first and second frame recesses adjacent to said slide slot, said first and second clamps being located in said first and second frame recess respectively when attached to said frame, each of said clamps being secured within its respective frame recess by a clamp screw extending through said clamp and into said frame, said frame recess and said clamp having screw holes to receive said clamp screw.

24. The vacuum valve of claim 20 wherein said first and second clamp detents and said first and second slide detents, when said slide is in said second position, are substantially positioned on a plane passing substantially through said beam line and substantially perpendicular to said slide axis.

25. The vacuum valve of claim 20 wherein said inner surface of said slide has a seal positioned to engage said slide slot surface around said frame orifice, and to substantially seal said frame orifice when said slide is in said second position.

26. The vacuum valve of claim 25 wherein said seal is an o-ring constructed of an elastomeric material.

27. The vacuum valve of claim 20 wherein the frame thickness, measured between and perpendicular to said first surface and said second surface of said valve, is not more than 0.5 inches.

28. The vacuum valve of claim 20 wherein said frame includes a plurality of securement apertures extending through said frame between, and substantially perpendicular to, said first and second surfaces of said frame, said securement apertures being utilized to couple said valve to adjacent particle accelerator components.

29. The vacuum valve of claim 20 wherein said slide, frame, and first and second clamps are constructed from a highly electrically conductive material.

30. The vacuum valve of claim 20 wherein said slide, frame, and first and second clamps are constructed from oxygen free high purity copper.

31. A vacuum valve for use in one end of a first particle accelerator system component for maintaining a vacuum within said first component when said one end of said first component is uncoupled from a second particle accelerator system component adjacent to said first component along the beam line generated by the particle accelerator system, the valve comprising:

a frame having a slide axis, a first surface facing toward said second component, a second surface facing toward the interior volume of said first component, and an outer frame wall between said first and second surfaces, said first surface of said frame including a slide slot having a slot surface and a frame orifice extending through said frame between said slot surface and said second surface, wherein said frame orifice is positioned and sized in said frame to permit passage of a particle beam generated by said particle accelerator system along said beam line;

a slide having a slide orifice, an outer surface and an inner sealing surface, said slide being housed substantially within the slide slot and being movable between a first position and a second position along a slide axis, said slide in said first position permitting a particle beam to pass through said slide orifice and through said frame orifice along said beam line, said slide in said second position preventing a particle beam from passing through said frame aperture, wherein said inner sealing surface of said slide engages said slot surface of said frame to substantially seal said frame orifice when said slide is in said second position; and a shaft translatable relative to said frame in a direction substantially parallel to said slide axis, said shaft extending from said slide in a direction substantially perpendicular to said slide axis and toward said outer frame wall, wherein translation of said shaft selectively controls the movement of said slide between said first and second positions;

wherein said outer surface of said slide and said first surface of said frame form a substantially flat surface substantially perpendicular to said beam line and surrounding said slide orifice, and wherein said second surface of said frame forms a substantially flat surface substantially perpendicular to said beam line and surrounding said frame orifice.

32. The vacuum valve of claim 31 wherein said frame is an end plate of said first component.

33. The vacuum valve of claim 32 wherein said first component is a radio frequency quadrupole.

34. The vacuum valve of claim 33 wherein said slide and said frame are constructed from oxygen free high purity copper.

35. A vacuum valve for use in one end of a first particle accelerator system component for maintaining a vacuum within said first component when said one end of said first component is uncoupled from a second particle accelerator system component adjacent to said first component along the beam line generated by the particle accelerator system, the valve comprising:

a frame having a slide axis, a first surface facing toward said second component, a second surface facing toward the interior volume of said first component, and an outer frame wall between said first and second surfaces, said first surface of said frame including a slide slot having a slot surface and a frame orifice extending through said frame between said slot surface and said second surface, wherein said frame orifice is positioned and sized in said frame to permit passage of a particle beam generated by said particle accelerator system along said beam line;

a slide having a slide orifice, an outer surface and an inner sealing surface, said slide being housed substantially within the slide slot and movable between a first position and a second position along a slide axis, said slide in said first position permitting a particle beam to pass through said slide orifice and through said frame orifice along said beam line, said slide in said second position preventing a particle beam from passing through said frame aperture, wherein said inner sealing surface of said slide engages said slot surface of said frame to substantially seal said frame orifice when said slide is in said second position;

a shaft translatable relative to said frame in a direction substantially parallel to said slide axis, said shaft extending from said slide in a direction substantially perpendicular to said slide axis and toward said outer frame wall, wherein translation of said shaft selectively controls the movement of said slide between said first and second positions;

a first clamp having a first inner clamp surface and an outer first clamp surface, said first inner clamp surface engaging a first side of said slide and maintaining said slide substantially within said slide slot; and a second clamp having a second inner clamp surface and an outer second clamp surface, said second inner clamp surface engaging a second side of said slide substantially opposite the side of said slide contacted by said first inner clamp surface, and maintaining said slide substantially within said slide slot;

wherein said slide has a first slide detent extending toward said first clamp and a second slide detent extending toward said second clamp, said first clamp has a first clamp detent extending toward said slide, and said second clamp has a second clamp detent extending toward said slide, said first clamp detent being positioned to engage said first slide detent, and said second clamp detent being positioned to engage said second slide detent, when said slide is moved from said first position to said second position, to thereby bias said inner surface of said slide toward said frame orifice and against said slot surface to substantially seal said frame orifice when said slide is in said second position.

36. The vacuum valve of claim 35 wherein said frame is an end plate of said first component.

37. The vacuum valve of claim 36 wherein said first component is a radio frequency quadrupole.

38. The vacuum valve of claim 37 wherein said slide and said frame are constructed from oxygen free high purity copper.

* * * * *

UNITED STATES PATENT AND TRADEMARK OFFICE
CERTIFICATE OF CORRECTION

PATENT NO.   : 6,377,004 B1
DATED        : April 23, 2002
INVENTOR(S)  : Floyd Del McDaniel, James M. Potter and Gan Li It is certified that error appears in the above-identified patent and that said Letters Patent is hereby corrected as shown below:

Title page,
Item [57], ABSTRACT,
Line 13, please add -- . -- after "line" at the end of the paragraph.

Column 3,
Line 19, replace ";" with -- . --.

Column 6,
Line 10, replace "electromagnetic" with -- electro-magnetic --.

Column 11,
Line 14, insert -- recesses -- between "head" and "to".

Column 14,
Line 7, insert -- lines) -- between "broken" and "of"

Column 22,
Line 33, remove "and" after ";".
Line 39, insert -- and -- after ";".

Signed and Sealed this

Third Day of December, 2002

JAMES E. ROGAN
*Director of the United States Patent and Trademark Office*